United States Patent
Peng et al.

(10) Patent No.: US 11,211,492 B2
(45) Date of Patent: Dec. 28, 2021

(54) METHOD OF MANUFACTURING SEMICONDUCTOR DEVICES HAVING A SIGE EPITAXTIAL LAYER CONTAINING GA

(71) Applicant: TAIWAN SEMICONDUCTOR MANUFACTURING CO., LTD., Hsinchu (TW)

(72) Inventors: Cheng-Yi Peng, Taipei (TW); Carlos H. Diaz, Los Altos Hills, CA (US); Chun Hsiung Tsai, Xinpu Township (TW); Yu-Ming Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 17 days.

(21) Appl. No.: 16/586,126

(22) Filed: Sep. 27, 2019

(65) Prior Publication Data
US 2020/0044085 A1 Feb. 6, 2020

Related U.S. Application Data

(62) Division of application No. 15/908,265, filed on Feb. 28, 2018, now Pat. No. 10,923,595.

(Continued)

(51) Int. Cl.
*H01L 29/78* (2006.01)
*H01L 27/092* (2006.01)
(Continued)

(52) U.S. Cl.
CPC ...... *H01L 29/7848* (2013.01); *H01L 27/0924* (2013.01); *H01L 29/0847* (2013.01);
(Continued)

(58) Field of Classification Search
CPC .............. H01L 29/0843–0891; H01L 29/66636–66643;
(Continued)

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |

(Continued)

FOREIGN PATENT DOCUMENTS

| | | |
|---|---|---|
| CN | 103839816 A | 6/2014 |
| CN | 105762068 A | 7/2016 |

(Continued)

OTHER PUBLICATIONS

Non-Final Office Action issued in related U.S. Appl. No. 15/908,265, dated Mar. 28, 2019.

(Continued)

*Primary Examiner* — Nelson Garces
(74) *Attorney, Agent, or Firm* — McDermott Will & Emery LLP

(57) ABSTRACT

A semiconductor device includes a field effect transistor (FET). The FET includes a channel region and a source/drain region disposed adjacent to the channel region. The FET also includes a gate electrode disposed over the channel region. The FET is an n-type FET and the channel region is made of Si. The source/drain region includes an epitaxial layer including $Si_{1-x-y}M1_xM2y$, where M1 is one or more of Ge and Sn, and M2 is one or more of P and As, and $0.01 \leq x \leq 0.1$.

20 Claims, 23 Drawing Sheets

Related U.S. Application Data

(60) Provisional application No. 62/593,061, filed on Nov. 30, 2017.

(51) Int. Cl.
*H01L 29/66* (2006.01)
*H01L 29/08* (2006.01)
*H01L 29/36* (2006.01)
*H01L 29/417* (2006.01)
*H01L 29/167* (2006.01)
*H01L 29/165* (2006.01)

(52) U.S. Cl.
CPC .......... *H01L 29/165* (2013.01); *H01L 29/167* (2013.01); *H01L 29/36* (2013.01); *H01L 29/41791* (2013.01); *H01L 29/66545* (2013.01); *H01L 29/66795* (2013.01); *H01L 29/785* (2013.01)

(58) Field of Classification Search
CPC . H01L 21/823418–823425; H01L 21/823814; H01L 29/41725–41791; H01L 29/7839; H01L 29/806; H01L 29/665–66507; H01L 29/7845; H01L 29/41783; H01L 21/823807; H01L 29/66696; H01L 29/66727; H01L 29/41741; H01L 2029/7858; H01L 29/66795; H01L 21/82821; H01L 27/0924; H01L 29/7851; H01L 21/823431; H01L 21/845; H01L 27/0886; H01L 27/10826; H01L 27/10879; H01L 27/1211; H01L 21/823456; H01L 29/785
See application file for complete search history.

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,331,200 B1 | 5/2016 | Wang et al. | |
| 9,418,897 B1 | 8/2016 | Ching et al. | |
| 9,466,723 B1* | 10/2016 | Huang | H01L 21/0217 |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,613,817 B1 | 4/2017 | Bentley et al. | |
| 9,754,822 B1 | 9/2017 | Chou et al. | |
| 9,799,736 B1 | 10/2017 | Ebrish et al. | |
| 9,812,363 B1 | 11/2017 | Liao et al. | |
| 9,859,380 B2 | 1/2018 | Lee et al. | |
| 10,109,533 B1 | 10/2018 | Xie et al. | |
| 2008/0163813 A1 | 7/2008 | Zollner et al. | |
| 2009/0140335 A1* | 6/2009 | Schneider | H01L 29/0847 |
| | | | 257/344 |
| 2013/0183814 A1 | 7/2013 | Huang et al. | |
| 2015/0041908 A1 | 2/2015 | Adam et al. | |
| 2015/0069532 A1 | 3/2015 | Xie et al. | |
| 2015/0318354 A1* | 11/2015 | Yin | H01L 29/7851 |
| | | | 257/288 |
| 2016/0099150 A1 | 4/2016 | Tsai et al. | |
| 2016/0172495 A1 | 6/2016 | Zhu et al. | |
| 2016/0240626 A1 | 8/2016 | Chang et al. | |
| 2017/0018464 A1 | 1/2017 | Kim et al. | |
| 2017/0104061 A1 | 4/2017 | Peng et al. | |
| 2017/0213889 A1 | 7/2017 | Gluschenkov et al. | |
| 2017/0256445 A1 | 9/2017 | Chou et al. | |
| 2017/0278968 A1* | 9/2017 | Lan | H01L 21/823807 |
| 2017/0372948 A1 | 12/2017 | Chou et al. | |
| 2019/0051757 A1* | 2/2019 | Bourjot | H01L 29/42384 |
| 2019/0057899 A1* | 2/2019 | Huang | H01L 21/76897 |
| 2019/0081044 A1* | 3/2019 | Avci | H01L 29/6659 |

FOREIGN PATENT DOCUMENTS

| | | |
|---|---|---|
| CN | 107230729 A | 10/2017 |
| KR | 10-2016-0040411 A | 4/2016 |
| TW | 201732975 A | 9/2017 |
| TW | 201735370 A | 10/2017 |

OTHER PUBLICATIONS

Final Office Action issued in related U.S. Appl. No. 15/908,265, dated Aug. 28, 2019.
U.S. Appl. No. 15/665,230, filed Jul. 31, 2017.

* cited by examiner

| | Rcsd |
|---|---|
| Reference | 1 |
| Example 1 | 0.69 |
| Example 2 | 0.69 |
| Example 3 | 0.82 |
| Example 4 | 0.91 |
| Example 5 | 0.65 |

FIG. 1

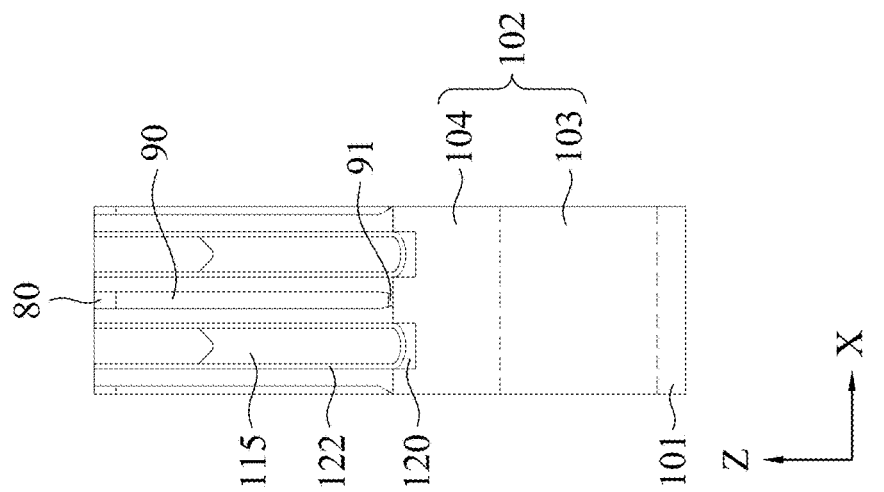
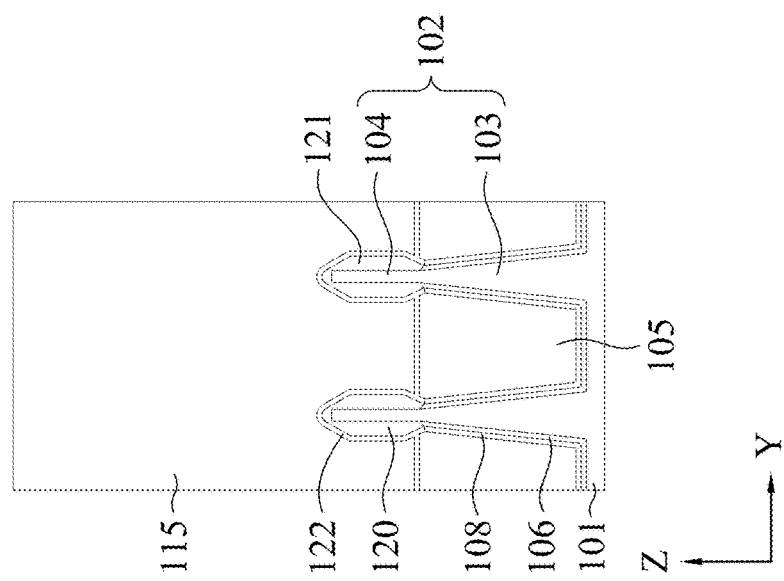
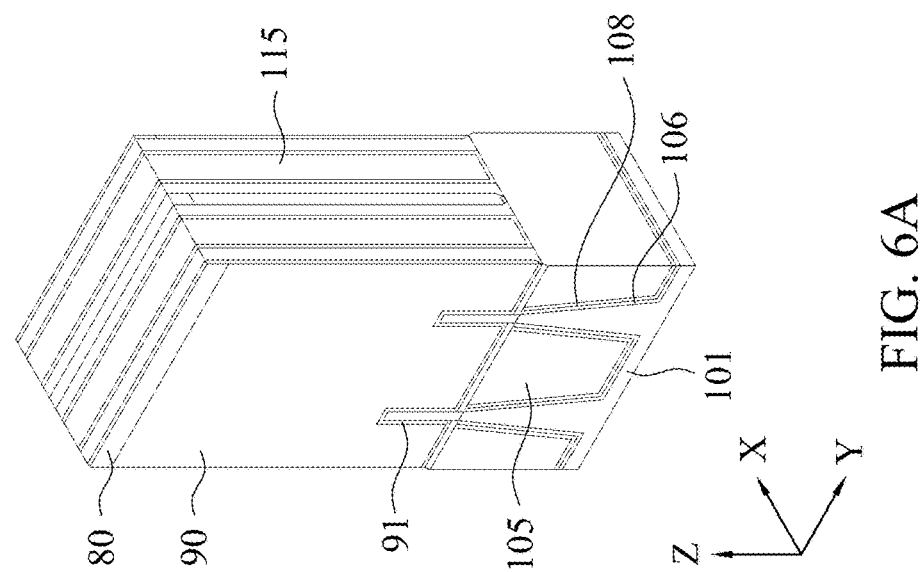

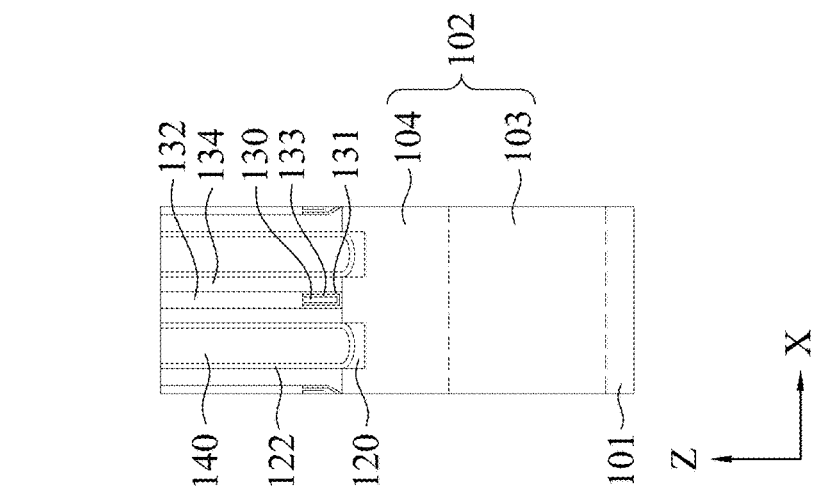
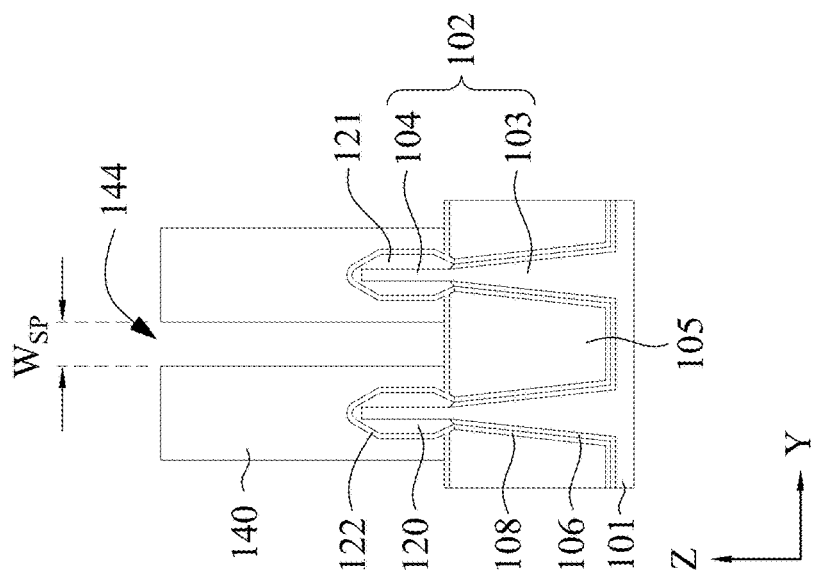
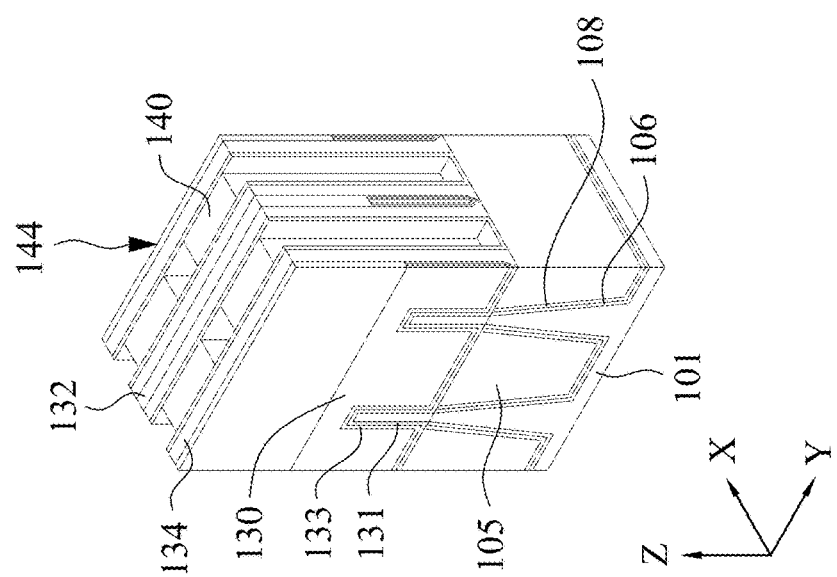
FIG. 16C
FIG. 16B
FIG. 16A

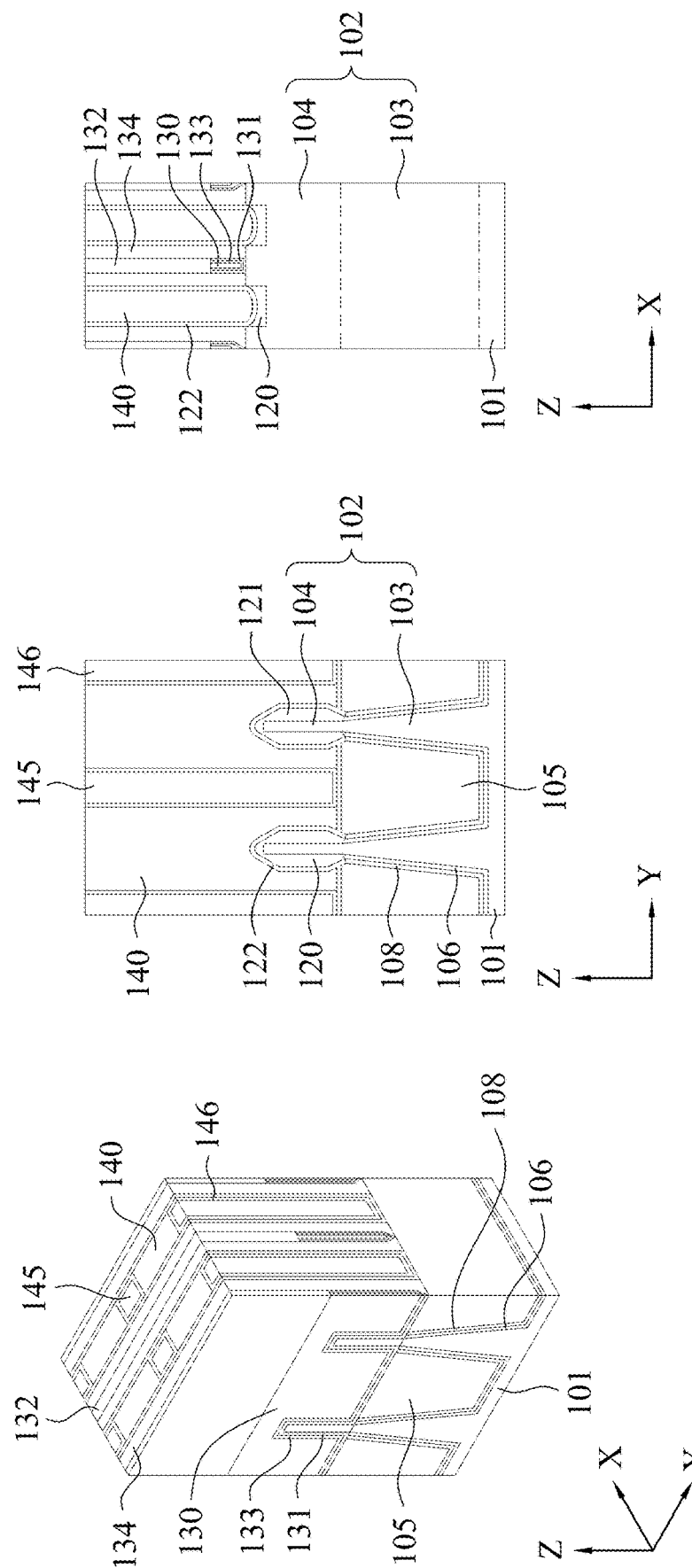

METHOD OF MANUFACTURING SEMICONDUCTOR DEVICES HAVING A SIGE EPITAXIAL LAYER CONTAINING GA

RELATED APPLICATION

This application is a divisional of application Ser. No. 15/908,265 filed on Feb. 28, 2018, which claims priority to U.S. Provisional Application No. 62/593,061 filed on Nov. 30, 2017, the entire contents of each of which are incorporated herein by reference.

TECHNICAL FIELD

The disclosure relates to methods of manufacturing semiconductor integrated circuits, and more particularly to methods of manufacturing semiconductor devices including fin field effect transistors (FinFETs), and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates experimental results of various epitaxial layers for a source/drain region of a p-type field effect transistor in accordance with embodiments of the present disclosure.

FIGS. 6A, 6B and 6C illustrate one of the various stages in a semiconductor device fabrication process in accordance with embodiments of the present disclosure.

FIGS. 16A, 16B and 16C illustrate one of the various stages in a semiconductor device fabrication process in accordance with embodiments of the present disclosure.

FIGS. 17A, 17B and 17C illustrate one of the various stages in a semiconductor device fabrication process in accordance with embodiments of the present disclosure.

DETAILED DESCRIPTION

Figure 2:
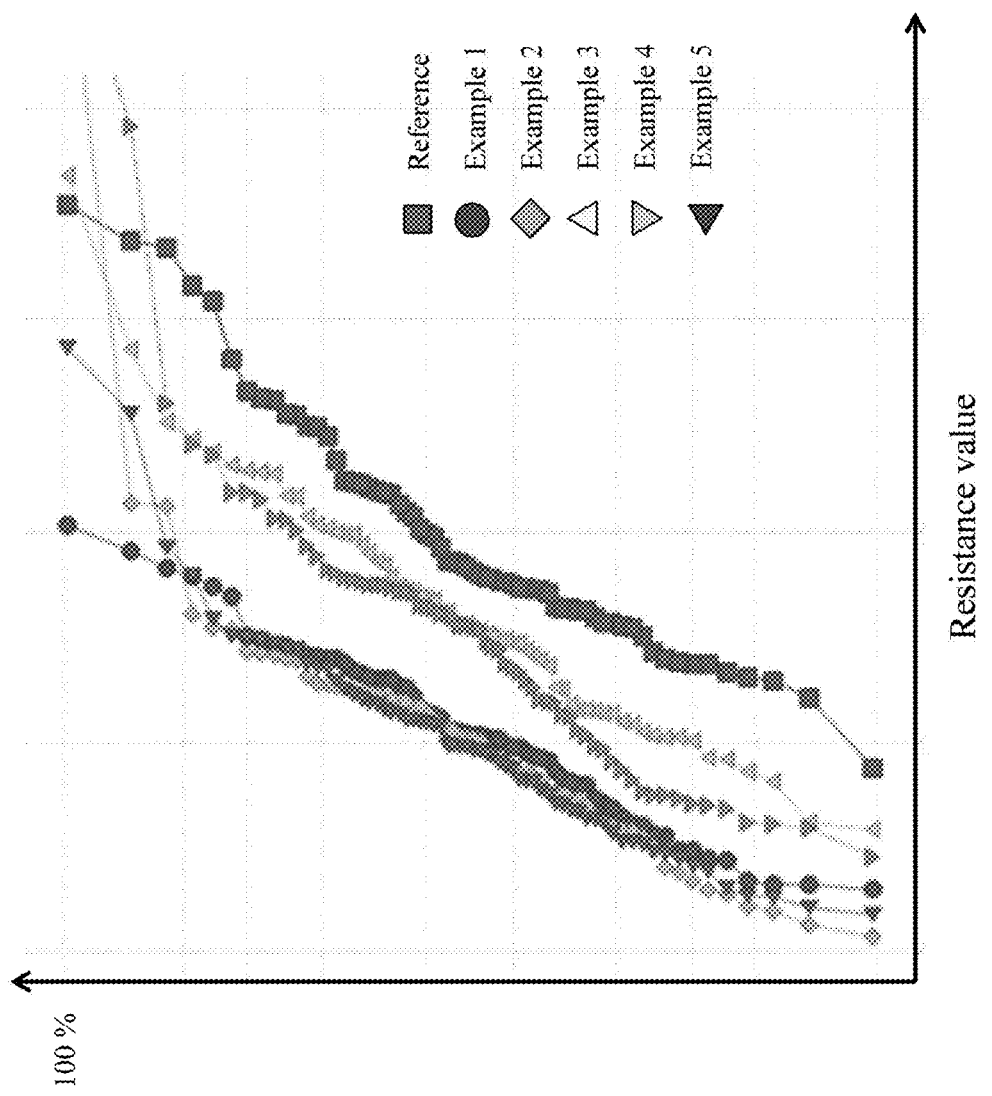
FIG. 2 illustrates experimental results showing Ga inclusion effects on electrical properties.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Disclosed embodiments relate to methods and structures of forming source/drain (S/D) structures for fin field-effect transistors (FinFETs), in particular for p-type FinFETs of a CMOS device. The embodiments such as those disclosed herein are generally applicable not only to FinFETs but also to a planar type FET, a double-gate, surround-gate, omega-gate or gate-all-around transistor, a 2-dimensional FET and/or a nanowire transistor, or any suitable device having source/drain epitaxial regions.

In order to achieve high-operational speed devices, carrier mobility in a channel region of an FET can be increased by applying appropriate stress to a crystalline semiconductor material in the channel region. As one technique to apply the stress, a crystalline semiconductor material having a different lattice constant than the channel region is provided at a source/drain region of the FET. A crystalline semiconductor material having a smaller lattice constant than the channel region is used in the source/drain (S/D) region of an n-type FET to apply tensile stress to the channel region. For example, SiP, SiC and/or SiCP are used for the S/D region of an n-type FET, where the channel region is made of silicon. On the other hand, a crystalline semiconductor material having a larger lattice constant than the channel region is used in the S/D region of a p-type FET to apply compressive stress to the channel region. For example, SiGe and/or Ge are used for the source/drain (S/D) region of a p-type FET, where the channel region is made of silicon. The crystalline semiconductor material for the S/D region is formed by an epitaxial growth method. In this disclosure, the term "source/drain" or "S/D" refers to a source and/or a drain and the source and the drain have substantially the same structure as each other.

In the present disclosure, the inventors found that adding Ga in a Ge-containing S/D epitaxial region for a p-type FET can decrease resistance of the S/D epitaxial layer and improve electrical properties of the S/D regions for a p-type FET.

For example, after the S/D epitaxial layers are formed, subsequent manufacturing operations including various thermal operations are performed to manufacture a semiconductor device. Such thermal operations, however, decrease the number of active carriers in the S/D regions, thereby increasing contact resistance between the S/D region and an S/D contact metal. However, as shown below, the incorporation of Ga in the Ge-containing epitaxial layer which contains a high Ge amount (e.g., 60 mol % or more) can release the local lattice stress more than a SiGe epitaxial layer without Ga, and can reduce contact resistance with a metallic layer.

In some embodiments, the source/drain region of a p-type FET includes an S/D epitaxial layer including $Si_{1-x-y}Ge_xSn_y$ doped with Ga, where $0.6 \le x \le 1.0$. In certain embodiments, the epitaxial layer is one or more selected from the group consisting of SiGe (y=0), Ge (x=1, y=0), SiGeSn (x≠1, y≠0), and GeSn (x+y=1), where the Ge amount is about 60 mol % or more ($0.6 \le x \le 1.0$) of the total of Si, Ge and/or Sn. In other embodiments, the Ge amount is about 80 mol % or more ($0.8 \le x \le 1.0$) of the total of Si, Ge and/or Sn. In certain embodiments, the Ge amount is about 50 mol % or more ($0.5 \le x \le 1.0$) of the total of Si, Ge and/or Sn.

In some embodiments, a concentration of Ga is in a range from about $1.0 \times 10^{18}$ atoms/cm$^3$ to about $1.0 \times 10^{22}$ atoms/cm$^3$. In certain embodiments, the concentration of Ga is in a range from about $5.0 \times 10^{18}$ atoms/cm$^3$ to about $7.0 \times 10^{21}$ atoms/cm$^3$. In other embodiments, the concentration of Ga is in a range from $1.0 \times 10^{19}$ atoms/cm$^3$ to $1.0 \times 10^{21}$ atoms/cm$^3$. When the concentration of Ga is in these ranges, it is possible to reduce the S/D resistance Rcsd.

In some embodiments, the concentration of Ga is not uniform in the S/D epitaxial layer. In some embodiments, the concentration of Ga decreases from an outer surface of the S/D epitaxial layer toward the inside the S/D epitaxial layer. In certain embodiments, the concentration of Ga continuously decreases from the outer surface of the S/D epitaxial layer toward the inside the S/D epitaxial layer. In other embodiments, the concentration of Ga decreases in a stepwise manner from the outer surface of the S/D epitaxial layer toward the inside the S/D epitaxial layer.

In some embodiments, the S/D epitaxial layer is further doped with boron and/or indium. In other embodiments, the S/D epitaxial layer does not contain any dopant intentionally introduced other than Ga.

FIG. 1 illustrates experimental results of various epitaxial layers for a source/drain region of a p-type field effect transistor in accordance with embodiments of the present disclosure. FIG. 1 shows resistance Rcsd of the S/D epitaxial layers for various samples. In FIG. 1, Reference is for an S/D epitaxial layer including SiGe doped with boron, Examples #1 and #2 are for an S/D epitaxial layer including SiGe doped with Ga, Examples #3 and #4 are for an S/D epitaxial layer including SiGe doped with Ga formed by different conditions than Examples #1 and #2, and Example #5 is for an S/D epitaxial layer including SiGe doped with Ga and B. In all samples, the Ge concentration of the SiGe epitaxial layer is 60% or more. For Examples #1-#5 of FIG. 1, ion implantation is employed to introduce Ga into the SiGe epitaxial layer and an annealing operation at a temperature in a range from about 800° C. to about 900° C. for a short period of time (e.g., microsecond order or less). The implantation energy for Examples #1 and #2 is smaller than implantation energy for Examples #3 and #4.

As shown in FIG. 1, incorporation of Ga into the SiGe epitaxial layer reduces the S/D resistance Rcsd by about 10% to about 30% compared with a SiGe epitaxial layer without Ga.

FIG. 2 illustrates another experimental result showing GA inclusion effects on electrical properties. FIG. 2 shows the relationship between resistance values and accumulative numbers in percent (cumulative probability). As shown in FIG. 2, when Ga is incorporated into the SiGe epitaxial layer, variation of the resistance value becomes smaller than the case where no Ga is added.

Figure 3C:
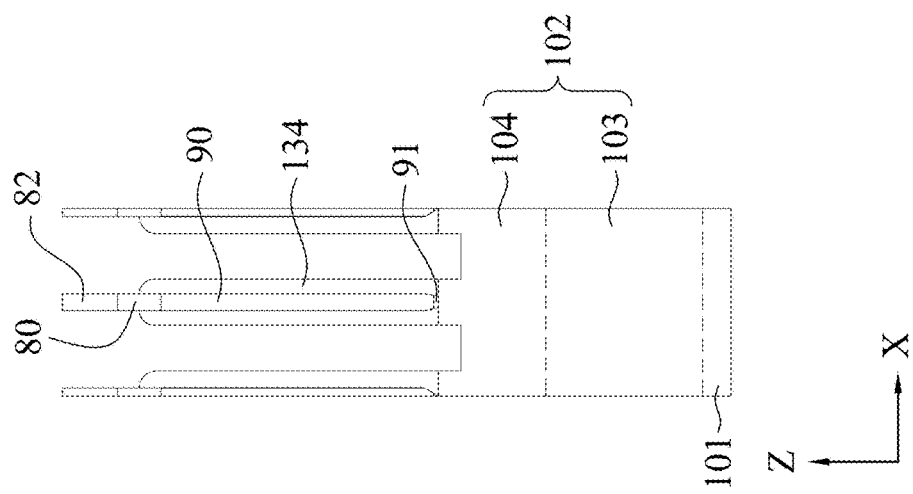
FIGS. 3A, 3B and 3C illustrate one of the various stages in a semiconductor device fabrication process in accordance with embodiments of the present disclosure.
Figure 3B:
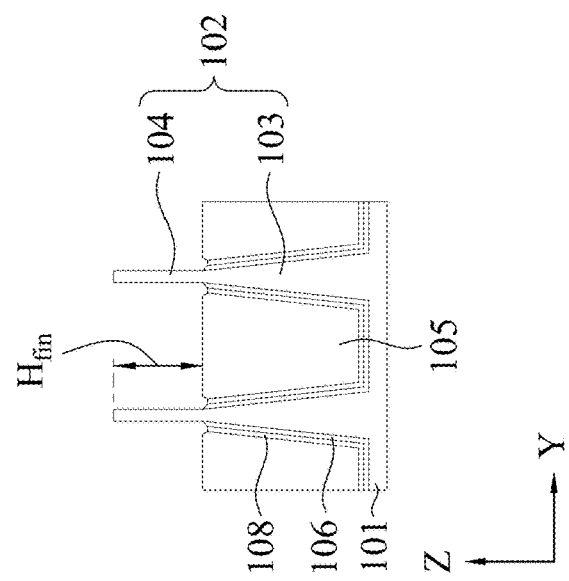
Figure 3A:
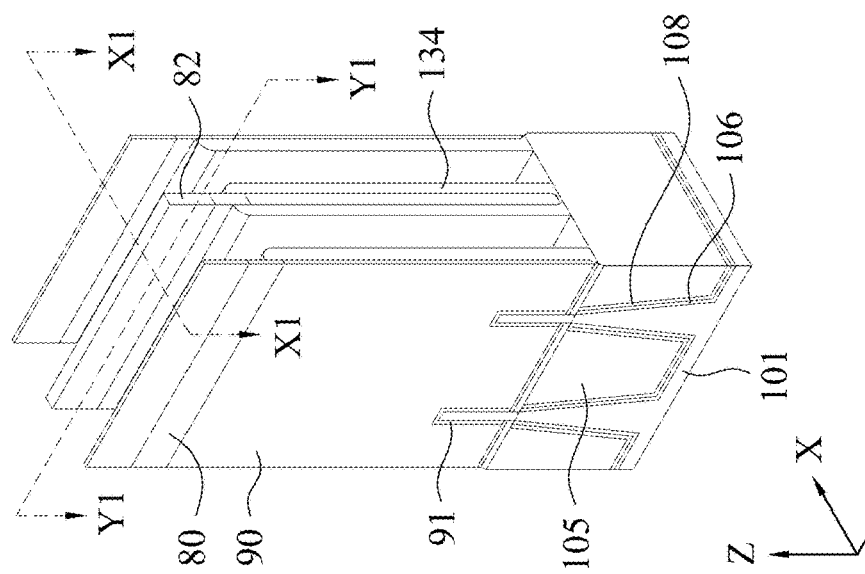

FIGS. 3A-19C illustrate various processes in a semiconductor device fabrication process in accordance with some embodiments of the present disclosure. Throughout the various views and illustrative embodiments, like reference numbers are used to designate like elements. In FIGS. 3A-19C, the "A" figures (e.g., FIGS. 3A, 4A, etc.) illustrate a perspective view, the "B" figures (e.g., FIGS. 3B, 4B, etc.)

illustrate a cross-sectional view along the Y direction corresponding to line Y1-Y1 illustrated in FIG. 3A, and the "C" figures (e.g., FIG. 3C, 4C, etc.) illustrate a cross-sectional view along the X direction corresponding to line X1-X1 illustrated in in FIG. 3A. It is understood that additional operations can be provided before, during, and after the processes shown by FIGS. 3A-19C, and some of the operations described below can be replaced or eliminated, for additional embodiments of the method. The order of the operations/processes may be interchangeable.

Referring first to FIGS. 3A-3C, FIGS. 3A-3C illustrate the structure after dummy gate structures are formed. In FIGS. 3A-3C, there is shown a substrate 101 having one or more fin structures, with two fin structures 102 being illustrated. It is understood that two fin structures are illustrated for purposes of illustration, but other embodiments may include any number of fin structures. In some embodiments, one or more dummy fin structures are formed adjacent to the fin structure for an active FinFET. The fin structure 102 extends in the X direction and protrudes from the substrate in the Z direction, while the gate 130 (see FIG. 11A) extends in the Y direction.

The substrate 101 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 101 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. Further, the substrate 101 may include an epitaxial layer (epi-layer), which may be strained for performance enhancement, and/or may include a silicon-on-insulator (SOI) structure.

The fin structure 102 may be formed using, for example, a patterning process to form trenches in the substrate 101 such that a trench is formed between adjacent fin structures 102. As discussed in greater detail below, the fin structure 102 will be used to form a FinFET. A part of the upper portion 104 of the fin structure 102 is a channel region of the FinFET.

Isolation regions, such as shallow trench isolations (STI) 105, are disposed in the trenches over the substrate 101. Prior to forming the isolation insulating layer 105, one or more liner layers are formed over the substrate 101 and sidewalls of the bottom part 103 of the fin structures 102 in some embodiments. In some embodiments, the liner layers include a first fin liner layer 106 formed on the substrate 101 and sidewalls of the bottom part 103 of the fin structures 102, and a second fin liner layer 108 formed on the first fin liner layer 106. Each of the liner layers has a thickness between about 1 nm and about 20 nm in some embodiments.

In some embodiments, the first fin liner layer 106 includes silicon oxide and has a thickness between about 0.5 nm and about 5 nm, and the second fin liner layer 108 includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 105 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 105 is formed through a process such as CVD, flowable CVD (FCVD), or a spin-on-glass process, although any acceptable process may be utilized. Subsequently, portions of the isolation insulating layer 105 extending over the top surfaces of the fin structures 102, and portions of the liner layers over the top surfaces of the fin structures 102 are removed using, for example, an etch process, chemical mechanical polishing (CMP), or the like.

In some embodiments, the isolation insulating layer 105 and the liner layers are recessed to expose the upper portion 104 of the fin structure 102 as illustrated in FIGS. 3A-3C. In some embodiments, the isolation insulating layer 105 and the liner layers are recessed using single etch processes, or multiple etch processes. In some embodiments in which the isolation insulating layer 105 is made of silicon oxide, the etch process may be, for example, a dry etch, a chemical etch, or a wet cleaning process. For example, the chemical etch may employ a fluorine-containing chemical such as dilute hydrofluoric (dHF) acid. After the fin formation process, the fin height $H_{fin}$ is about 30 nm or higher, such as about 50 nm or higher, in some embodiments. In one embodiment, the fin height is between about 40 nm and about 80 nm. It is understood that the fin height may be modified by subsequent processing. Other materials, processes, and dimensions may be used.

After the fin structure 102 is formed, a dummy gate structure including a dummy gate dielectric layer 91 and a dummy gate electrode 90 are formed over the exposed fin structure 102. The dummy gate dielectric layer 91 and the dummy gate electrode 90 will be subsequently used to define and form the source/drain regions. In some embodiments, the dummy gate dielectric layer 91 and the dummy gate electrode 90 are formed by depositing and patterning a dummy dielectric layer formed over the exposed fin structures 102 and a dummy electrode layer over the dummy gate dielectric layer. The dummy dielectric layer may be formed by thermal oxidation, CVD, sputtering, or any other methods known and used in the art for forming a dummy dielectric layer. In some embodiments, the dummy dielectric layer 91 is made of one or more suitable dielectric materials such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, $SiO_2$ is used.

In some embodiments, the dummy electrode layer 90 is a conductive material and may be selected from a group comprising amorphous silicon, poly silicon, amorphous germanium, poly germanium, amorphous silicon-germanium, poly silicon-germanium, metallic nitrides, metallic silicides, metallic oxides, and metals. The dummy electrode layer may be deposited by PVD, CVD, sputter deposition, or other techniques known and used in the art for depositing conductive materials. Other materials, conductive and non-conductive, may be used. In one embodiment, poly-Si is used.

A mask pattern may be formed over the dummy electrode layer to aid in the patterning. In some embodiments, a hard mask pattern including a first layer 80 and a second layer 82 is formed over a blanket layer of polysilicon. The hard mask pattern is made of one or more layers of $SiO_2$, SiCN, SiON, $Al_2O_3$, SiN, or other suitable materials. In certain embodiments, the first layer 80 includes silicon nitride (SiN) and the second layer 82 includes silicon oxide. By using the mask pattern as an etching mask, the dummy electrode layer is patterned into the dummy gate electrode 90. In some embodiments, the dummy dielectric layer 91 is also patterned to define the dummy gate dielectric layer.

Subsequently, sidewall spacers 134 are formed along sidewalls of the dummy gate structure. The sidewall spacers 134 may be formed by depositing and anisotropically etching an insulating layer deposited over the dummy gate structures, the fin structure 102, and the isolation insulating layer 105. In some embodiments, the sidewall spacers 134 are formed of silicon nitride, and have a single-layer structure. In alternative embodiments, the sidewall spacers 134 have a composite structure including a plurality of layers. For example, the sidewall spacers 134 include a silicon oxide layer and a silicon nitride layer over the silicon oxide layer. Other materials, such as $SiO_2$, SiCN, SiON, SiN, SiOCN, other low k material, or combinations thereof, may also be used. The thickness of the sidewall spacer 134 is in a range from about 5 nm to about 40 nm in some embodiments.

Figure 4C:
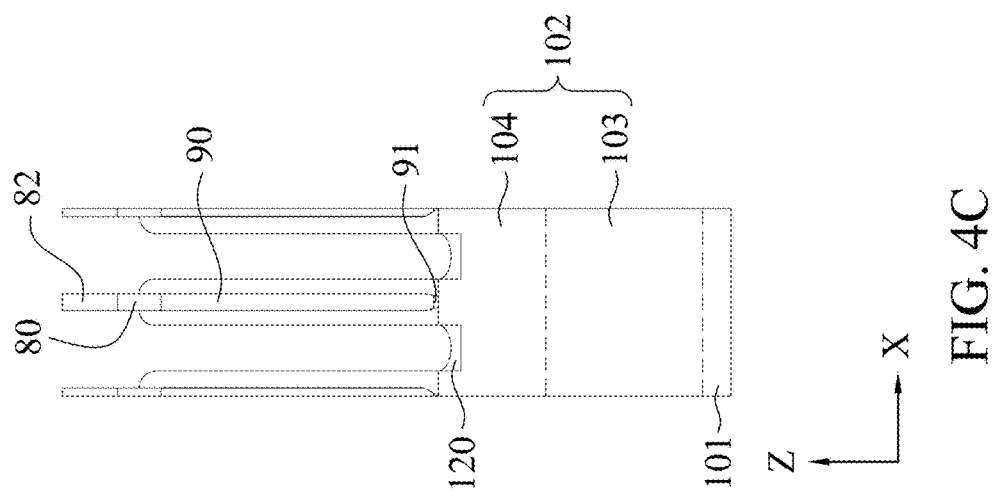
FIGS. 4A, 4B and 4C illustrate one of the various stages in a semiconductor device fabrication process in accordance with embodiments of the present disclosure.
Figure 4B:
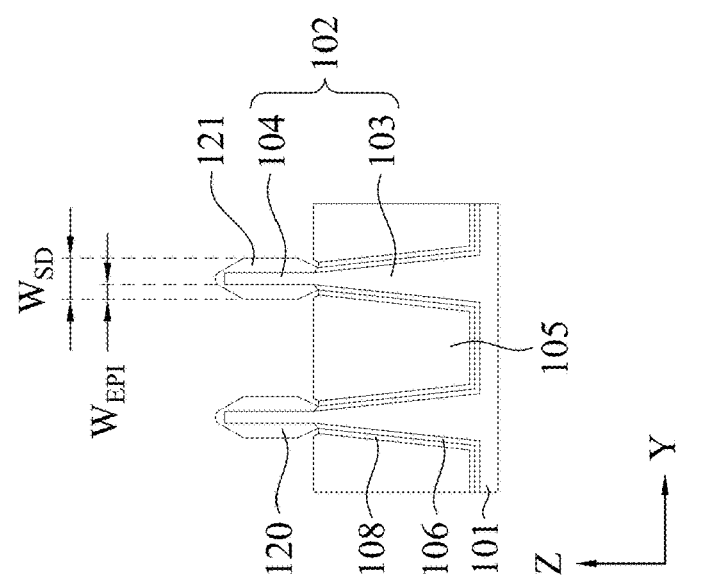
Figure 4A:
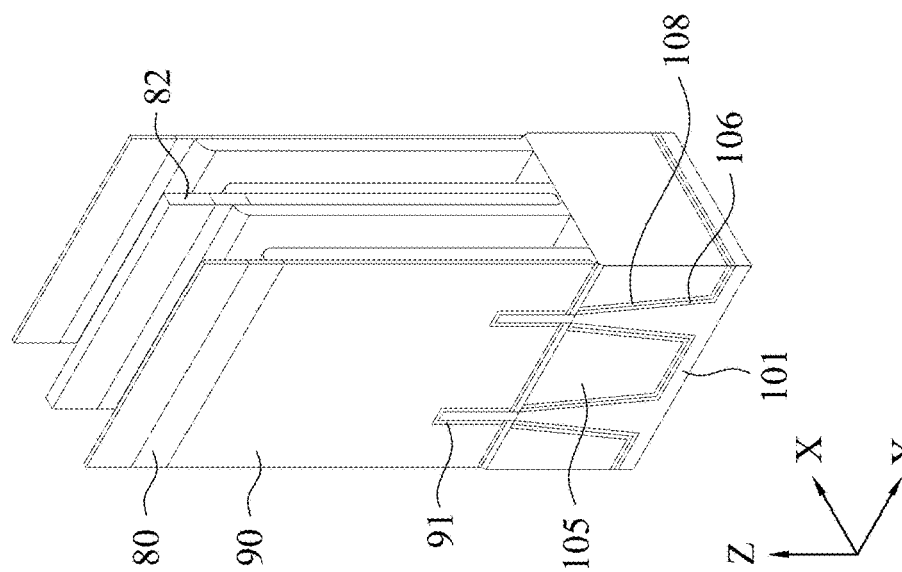

After the dummy gate structure and the sidewall spacers are formed, source/drain (S/D) structures 120 and 121 are formed on exposed portions 104 of the fin structures 102 along opposing sides of the dummy gate structure, as shown in FIGS. 4A-4C. The S/D structures 120 and 121 may be epitaxially formed on the side faces and the top face of the exposed fin structure 104. In some embodiments, the fin structure 104 may be recessed and the S/D structure is epitaxially formed on the exposed portion of the recessed fin. The use of epitaxial grown materials in the source/drain regions allows for the source/drain regions to exert stress in a channel of a FinFET. When the S/D structures 120 and 121 are for different conductivity type FETs, the S/D structure 120 is formed while the fin structure for the S/D structure 121 is covered by a protective layer made of, for example, SiN, and then the S/D structure 121 is formed while the formed S/D structure 120 is covered by a protective layer. In one embodiment, the S/D structure 120 is for an n-type FinFET and the S/D structure 121 is for a p-type FinFET.

The materials used for the S/D structures 120 and 121 may be varied for n-type and p-type FinFETs, such that one type of material is used for the n-type FinFETs to exert a tensile stress in the channel region and another type of material for the p-type FinFETs to exert a compressive stress.

For the p-type FinFET, the S/D structure 121 includes an epitaxial layer including $Si_{1-x-y}Ge_xSn_y$, where $0.5 \leq x \leq 1.0$. In certain embodiments, $0.6 \leq x \leq 1.0$, and in other embodiments, $0.8 \leq x \leq 1.0$. In some embodiments, as set forth above, $Si_{1-x-y}Ge_xSn_y$ epitaxial layer is doped with B and/or In.

In some embodiments, $Si_{1-x-y}Ge_xSn_y$ epitaxial layer is doped with Ga. In some embodiments, a concentration of Ga is in a range from about $1.0 \times 10^{18}$ atoms/cm$^3$ to about $1.0 \times 10^{22}$ atoms/cm$^3$. In certain embodiments, the concentration of Ga is in a range from about $5.0 \times 10^{18}$ atoms/cm$^3$ to about $7.0 \times 10^{21}$ atoms/cm$^3$. In other embodiments, the concentration of Ga is in a range from $1.0 \times 10^{19}$ atoms/cm$^3$ to $1.0 \times 10^{21}$ atoms/cm$^3$.

In some embodiments, the S/D structure 121 includes two or more epitaxial layers with different composition and/or different dopant concentrations. In some embodiments, the Ga concentration in the $Si_{1-x-y}Ge_xSn_y$ epitaxial layer 121 increases as the distance from the fin structure 104 increases. The Ga concentration in a region closer to the fin structure 104 is smaller than that in a region closer to the outer surface of the S/D structure 121. The Ga concentration can gradually change or change in a stepwise manner.

In some embodiments, Ga is doped in the S/D epitaxial layer 121 by an in-situ doping technique during the epitaxial growth of $Si_{1-x-y}Ge_xSn_y$ layer. The source of Ga is for example, a trimethyl gallium (TMG) and/or triethylgallium (TEG). By varying the flow rate or flow amount of the Ga source gas (e.g., by gradually increasing), it is possible to modulate the Ga concentration within the S/D epitaxial layer 121. In certain embodiments, multiple epitaxial growth operations with different source and/or dopant gas flows are performed to form the graded profile of Ga. The epitaxial growth can be performed by using molecular beam epitaxy (MBE), chemical vapor deposition (CVD), and/or atomic layer deposition (ALD), or any acceptable epitaxial process. Boron and/or indium can also be introduced into the SiGe epitaxial layer by an in-situ doping technique.

In other embodiments, an ion implantation method is used to introduce Ga into the $Si_{1-x-y}Ge_xSn_y$ S/D epitaxial layer 121. In such a case, a Ga ion implantation is performed after the $Si_{1-x-y}Ge_xSn_y$ S/D epitaxial layer 121 is formed and before the $Si_{1-x-y}Ge_xSn_y$ S/D epitaxial layer 121 is covered by an interlayer dielectric layer (e.g., layer 115 (see FIG. 6)). In certain embodiments, a Ga ion implantation is performed after the contact openings (e.g., opening 149 of FIG. 18B or opening 149' of FIG. 20B) is formed. The implantation energy is in a range from about 1 keV to 10 keV in some embodiments, and is in a range from about 3 keV to 8 keV in other embodiments. In certain embodiments, multiple ion implantation operations with different dose amounts and/or acceleration energies are performed to form a graded profile of Ga. Boron and/or indium can also be introduced into the SiGe epitaxial layer by an ion implantation operation.

In other embodiments, a plasma doping method is used to introduce Ga into the $Si_{1-x-y}Ge_xSn_y$ S/D epitaxial layer 121. In such a case, a plasma doping operation is performed after the $Si_{1-x-y}Ge_xSn_y$ S/D epitaxial layer 121 is formed and before the $Si_{1-x-y}Ge_xSn_y$ S/D epitaxial layer 121 is covered by an interlayer dielectric layer (e.g., layer 115). In certain embodiments, a plasma doping operation is performed after the contact openings (e.g., opening 149 of FIG. 18B or opening 149' of FIG. 20B) is formed.

For an n-type FET, Si:P (silicon doped with P), SiC:P, and/or SiC may be used as the S/D structure 120 to form n-type FinFETs. In some embodiments, As is included in the S/D structure 120. In some embodiments, the S/D structure 120 includes two or more epitaxial layers with different compositions and/or different dopant concentrations.

As shown in FIGS. 4A and 4B, in some embodiments, the cross sections of the S/D structures 120 and/or 121 in the Y direction have substantially a hexagonal shape, and in other embodiments, the cross sections of the S/D structures 120 and/or 121 has a diamond shape, a pillar shape or a bar shape. The width $W_{SD}$ of the S/D structure in the Y direction is in a range from about 25 nm to about 100 nm in some embodiments. The thickness $W_{EPI}$ of the S/D structure in the Y direction is in a range from about 2 nm to about 10 nm in some embodiments.

Figure 5C:
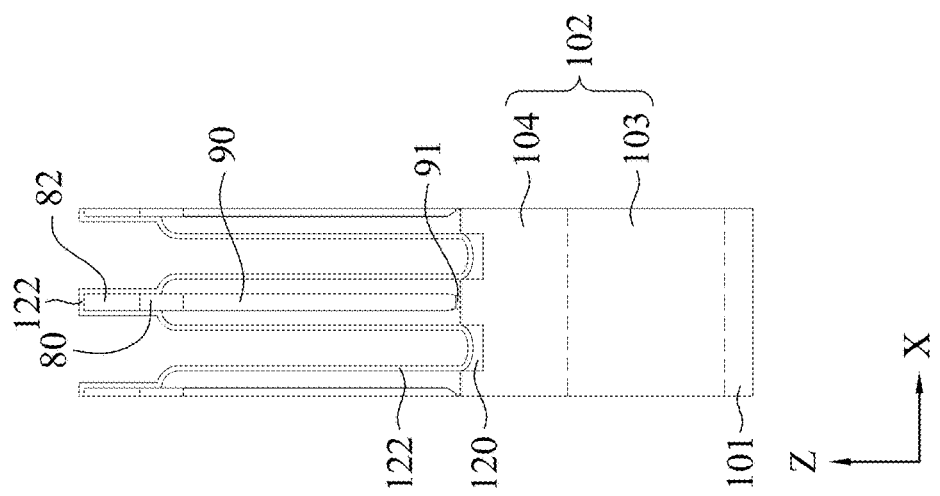
FIGS. 5A, 5B and 5C illustrate one of the various stages in a semiconductor device fabrication process in accordance with embodiments of the present disclosure.
Figure 5B:
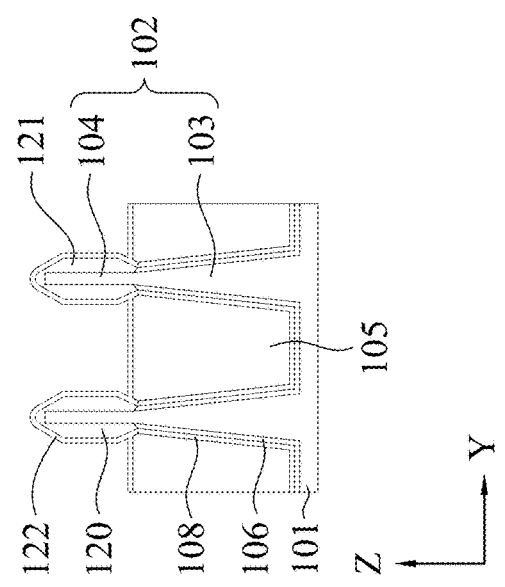
Figure 5A:
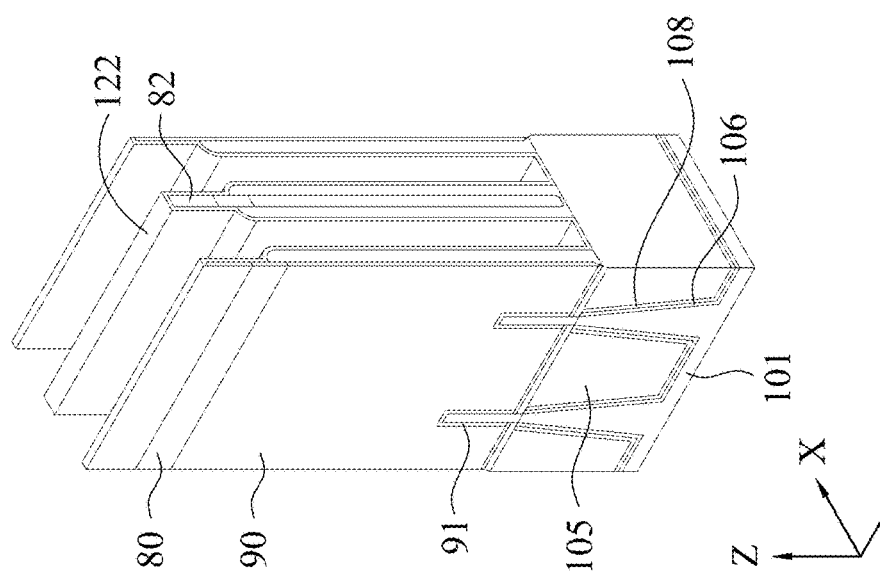

After the S/D structures 120 and 121 are formed, as shown in FIGS. 5A-5C, a first insulating layer 122 as a liner layer or a contact etch stop layer (CESL) is deposited to cover the S/D structures 120 and 121 and on the sidewalls spacers of the dummy gate structure. The first insulating layer 122 acts as an etch stop during the patterning of a subsequently formed dielectric material. In some embodiments, the first insulating layer 122 includes $SiO_2$, SiCN, SiON, SiN and other suitable dielectric materials. In one embodiment, SiN is used. The first insulating layer 122 may be made of a plurality of layers that comprises combinations of the above mentioned materials. The first insulating layer 122 may be deposited through one or more processes such as PVD, CVD, or ALD, although any acceptable process may be utilized. Other materials and/or processes may be used. In some embodiments, the first insulating layer 122 has a thickness between about 0.5 nm and about 10 nm. Other thicknesses may be used in other embodiments.

After the first insulating layer 122 is formed, a first sacrificial layer 115 is formed over the first insulating layer 122, as shown in FIGS. 6A-6C. In some embodiments, the first sacrificial layer 115 includes one or more layers of silicon based dielectric material, such as $SiO_2$, SiCN, SiON, SiOC, SiOH, $Si_3N_4$, or other suitable dielectric materials. In some embodiments, the first sacrificial layer 115 is formed through a film forming process, such as, CVD, PVD, ALD, FCVD, or a spin-on-glass process, although any acceptable process may be utilized. Subsequently, portions of the first insulating layer 122 are removed using, for example, an etch process, CMP, or the like, to expose the upper surface of the dummy gate electrode. In some embodiments, Ga in the S/D structure 121 diffuses into the first insulating layer 122 and/or dielectric layer 115.

Figure 7C:
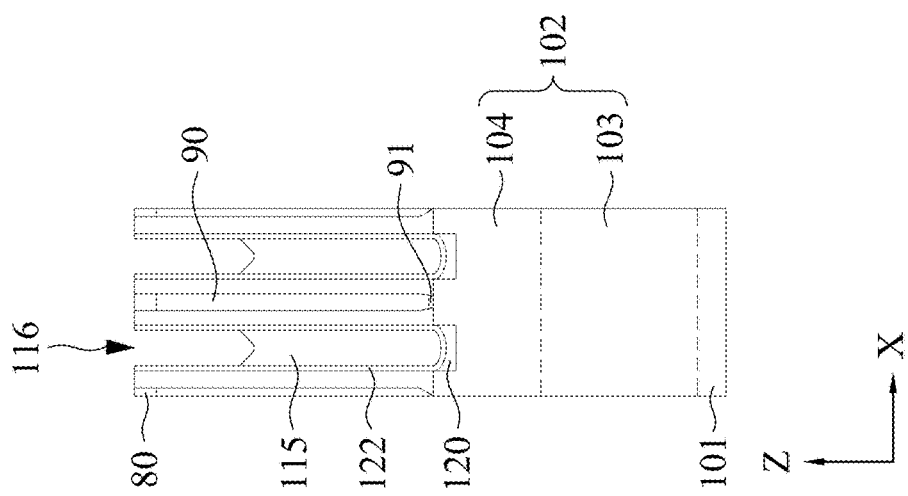
FIGS. 7A, 7B and 7C illustrate one of the various stages in a semiconductor device fabrication process in accordance with embodiments of the present disclosure.
Figure 7B:
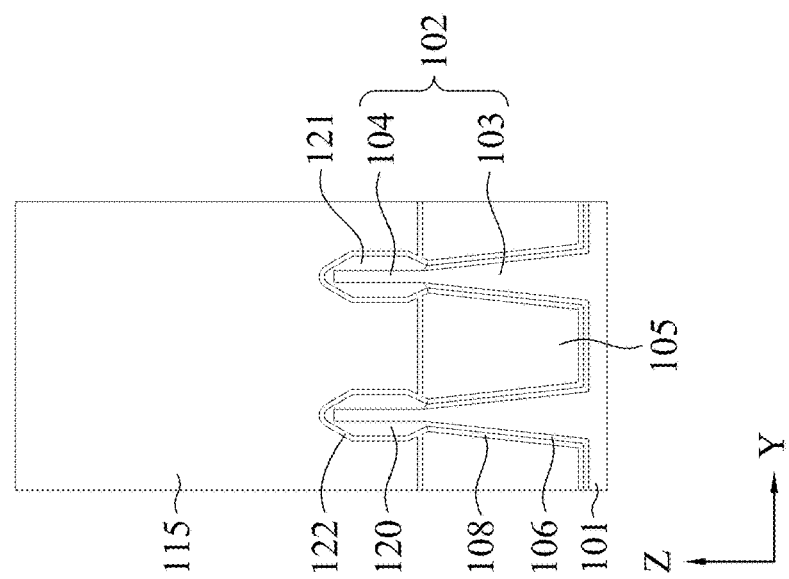
Figure 7A:
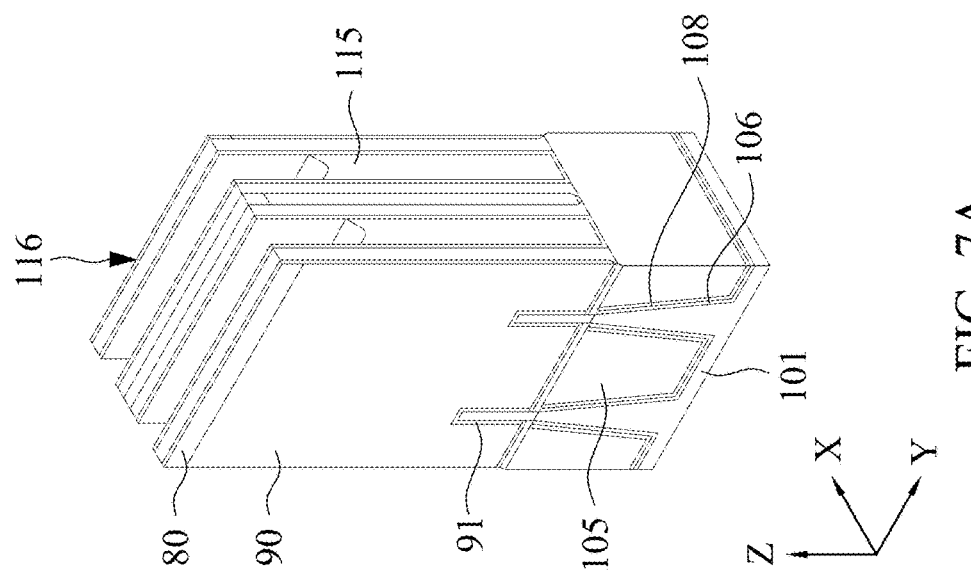

Subsequently, the first sacrificial layer 115 is partially recessed to a level of the middle portion of the dummy gate electrode 90 in the Z direction, thereby forming openings 116, as shown in FIGS. 7A-7C. The first sacrificial layer 115 can be recessed by an etch-back process and/or wet etching. The remaining thickness of the recessed first sacrificial layer 115 is in a range from about 40 nm to about 200 nm in some embodiments.

Figure 8C:
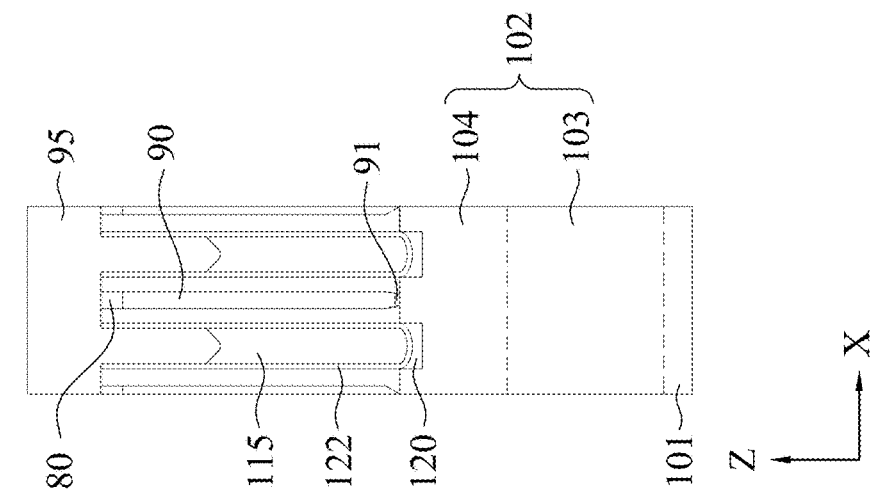
FIGS. 8A, 8B and 8C illustrate one of the various stages in a semiconductor device fabrication process in accordance with embodiments of the present disclosure.
Figure 8B:
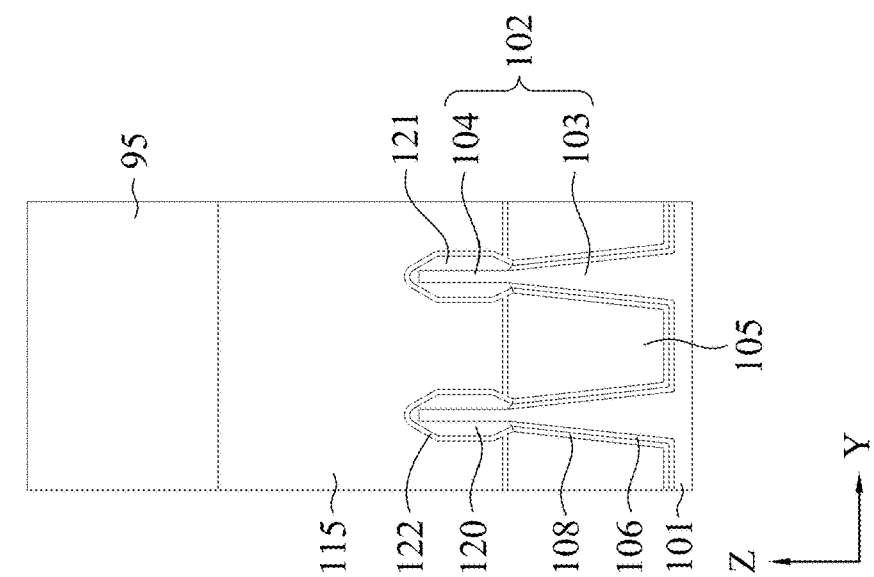
Figure 8A:
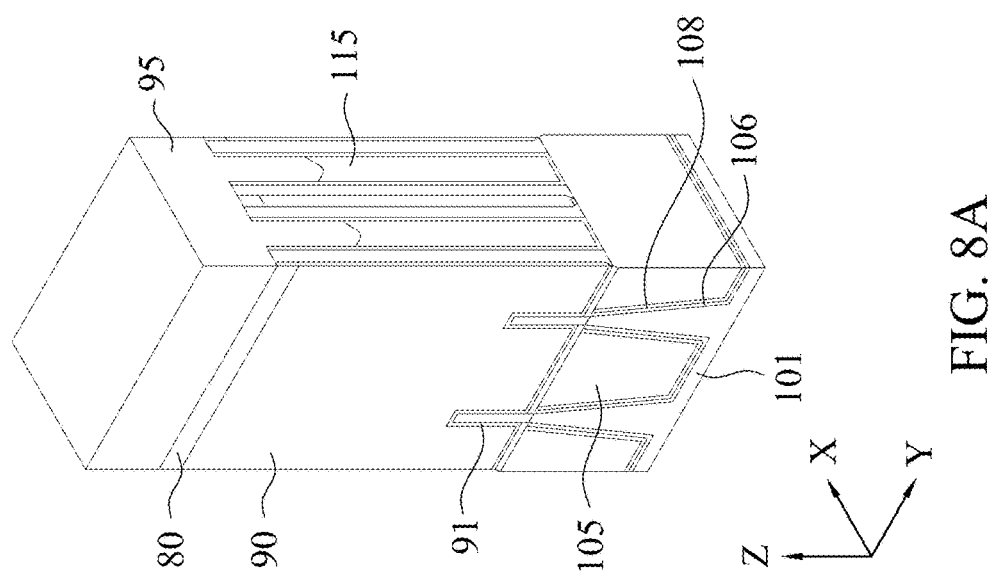
Figure 9C:
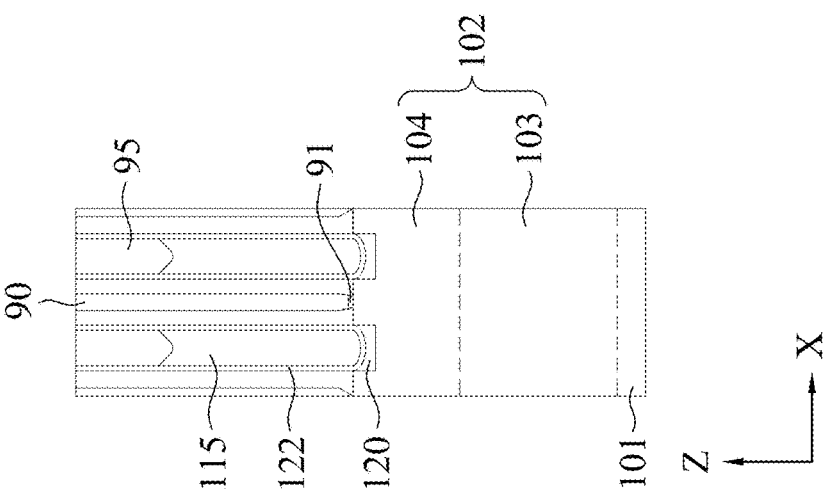
FIGS. 9A, 9B and 9C illustrate one of the various stages in a semiconductor device fabrication process in accordance with embodiments of the present disclosure.
Figure 9B:
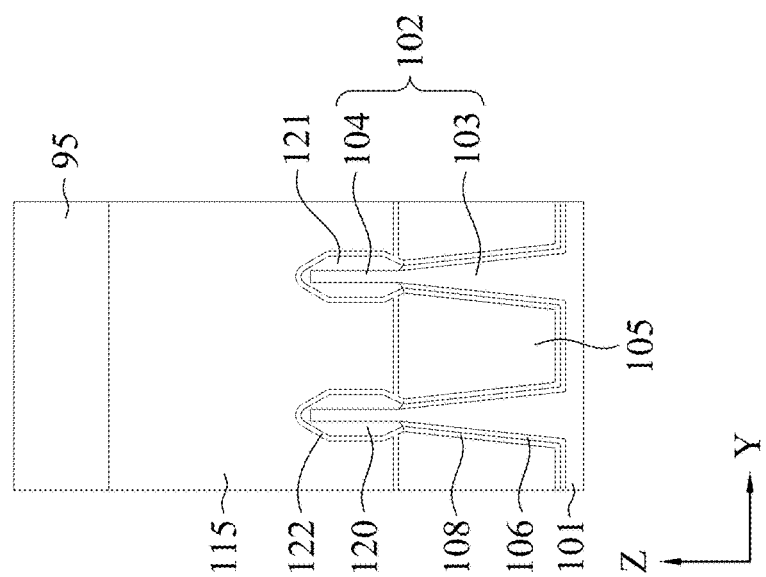
Figure 9A:
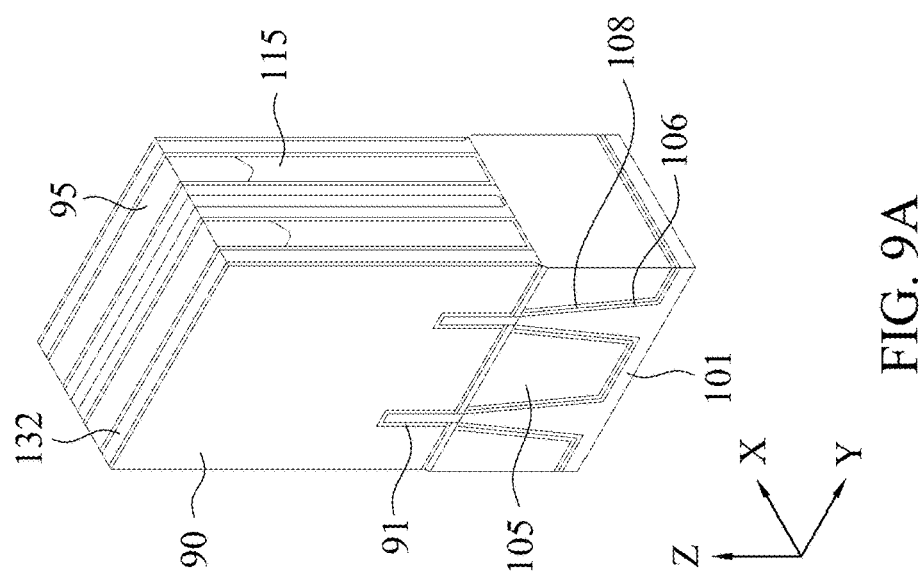

The openings 116 are filled with an insulating material, thereby forming a mask layer 95, as shown in FIGS. 8A-8C. In some embodiments, the mask layer 95 is made of one or more layers of SiOC, SiC, SiON, SiCN, SiOCN, $Si_3N_4$ and/or $SiO_2$. In one embodiment, $Si_3N_4$ is used. The mask layer 95 may be deposited through one or more processes such as PVD, CVD, or ALD, although any acceptable process may be utilized. A planarization operation, such as, an etch-back process or CMP, may be performed to planarize the upper surface of the mask layer 95 and hard mask layer 80, as shown in FIGS. 9A-9C. By the planarization operation, the hard mask layer 80 is removed, and the upper surface of the dummy gate electrode layer 90 is exposed.

Figure 10C:
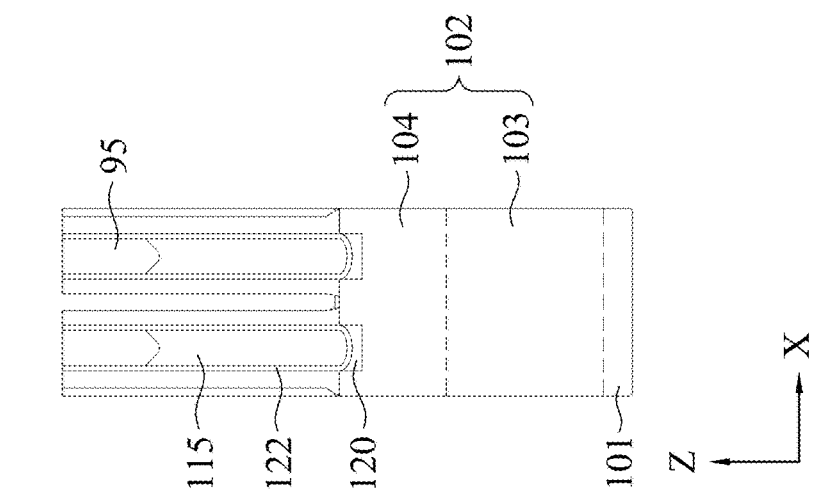
FIGS. 10A, 10B and 10C illustrate one of the various stages in a semiconductor device fabrication process in accordance with embodiments of the present disclosure.
Figure 10B:
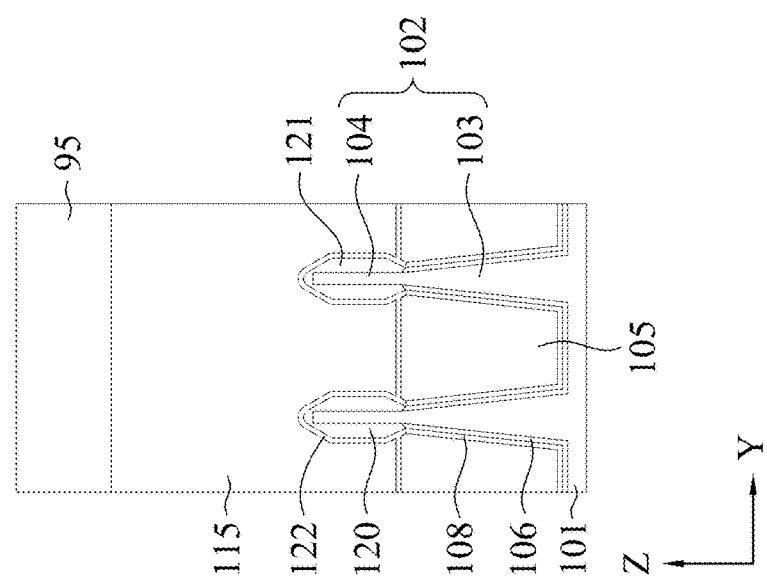
Figure 10A:
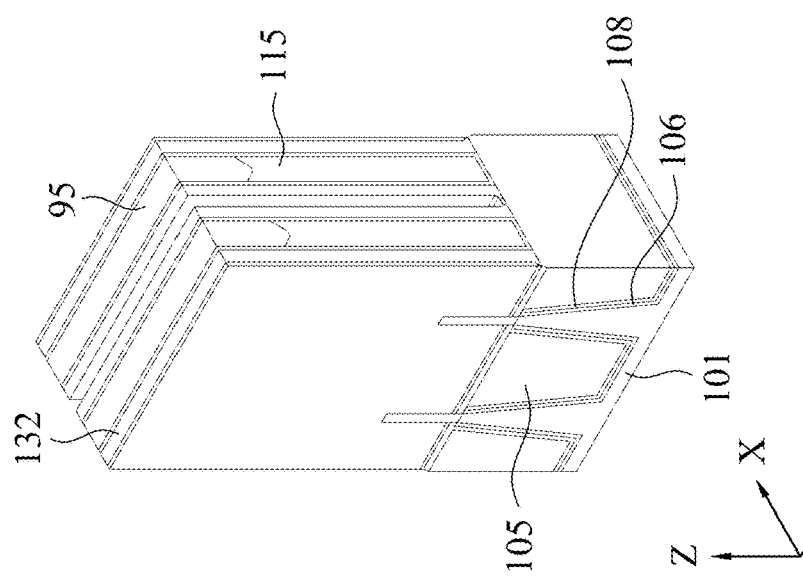

Subsequently, the dummy gate electrode 90 and the dummy gate dielectric layer 91 are removed, as shown in FIGS. 10A-10C. The removal process may include one or more etch processes. For example in some embodiments, the removal process includes selectively etching using either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like. The dummy gate dielectric layer may be removed using a wet etch process, such as a diluted HF acid. Other processes and materials may be used.

Figure 11C:
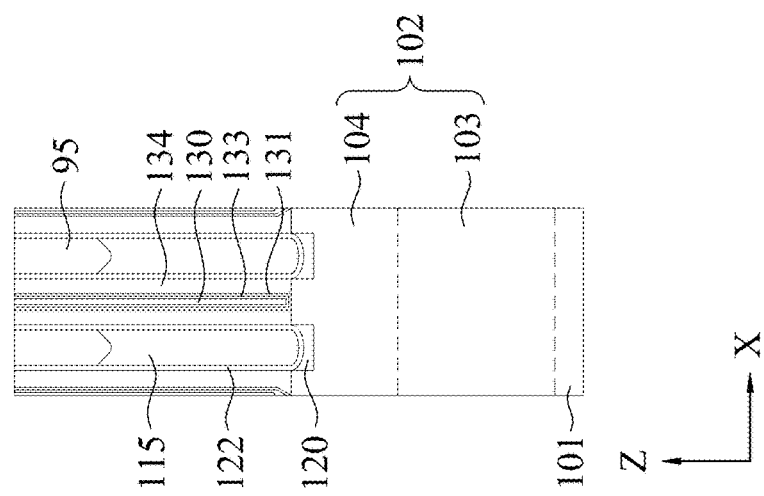
FIGS. 11A, 11B and 11C illustrate one of the various stages in a semiconductor device fabrication process in accordance with embodiments of the present disclosure.
Figure 11B:
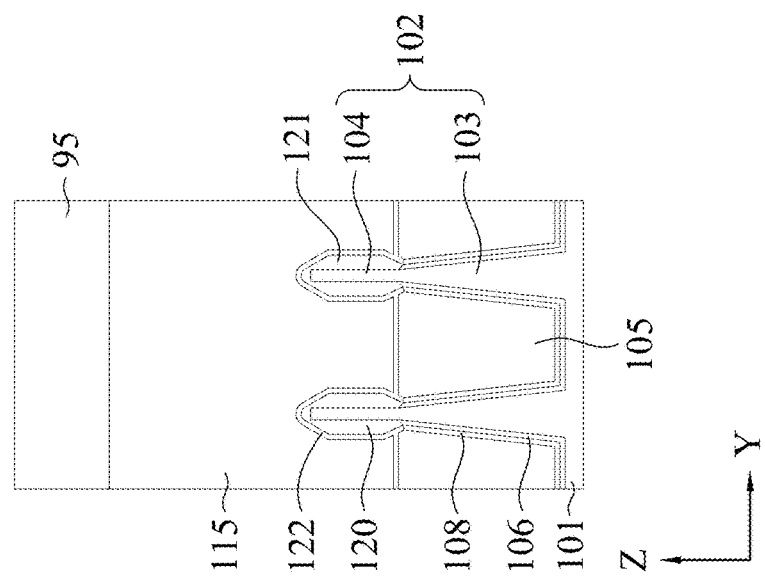
Figure 11A:
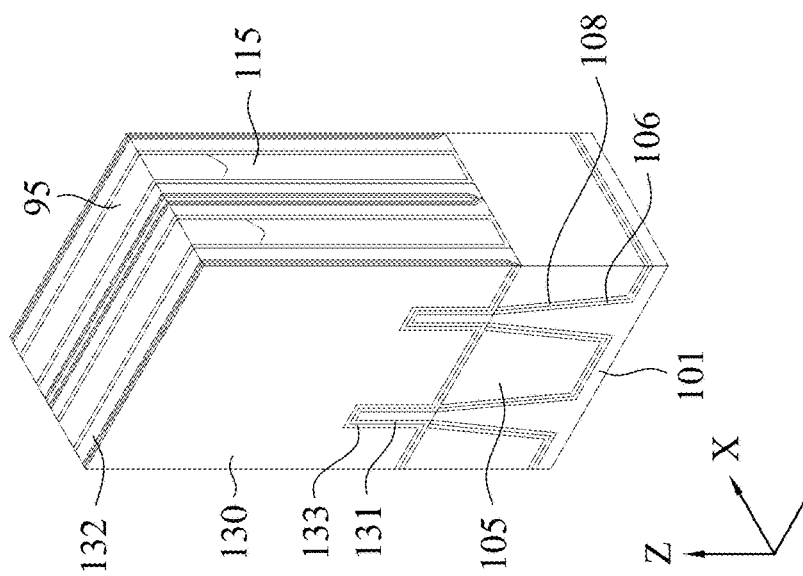

After the dummy gate structure is removed, a metal gate structure is formed as shown in FIGS. 11A-11C. A gate dielectric layer 131 is formed over a channel region of the fin structure 102. In some embodiments, the gate dielectric layer 131 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, $Si_3N_4$, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of gate dielectric layer 131 include molecular-beam deposition (MBD), ALD, PVD, and the like. In some embodiments, the gate dielectric layer 131 has a thickness of about 0.5 nm to about 5 nm. In some embodiments, the gate dielectric layer 131 is formed also on sides of the sidewall spacers 134.

In some embodiments, an interfacial layer (not shown) is formed over the channel region 104 prior to forming the gate dielectric layer 131, and the gate dielectric layer 131 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments utilize a different material or processes for the interfacial layer. In an embodiment, the interfacial layer has a thickness of about 0.2 nm to about 1 nm.

After the gate dielectric layer 131 is formed, a gate electrode 130 is formed over the gate dielectric layer 131. The gate electrode 130 may be a metal selected from a group of W, Cu, Ti, Ag, Al, TiAl, TiAlN, TaC, TaCN, TaSiN, Mn, Co, Pd, Ni, Re, Jr, Ru, Pt, and Zr. In some embodiments, the gate electrode 130 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 130 has a thickness in the range of about 5 nm to about 100 nm. The gate electrode 130 may be formed using a suitable process such as ALD, CVD, PVD, plating, or combinations thereof. A planarization process, such as CMP, may be performed to remove excess materials.

In certain embodiments of the present disclosure, the gate electrode 130 includes one or more work function adjustment layers (not shown) disposed on the gate dielectric layer 131. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

Figure 12A:
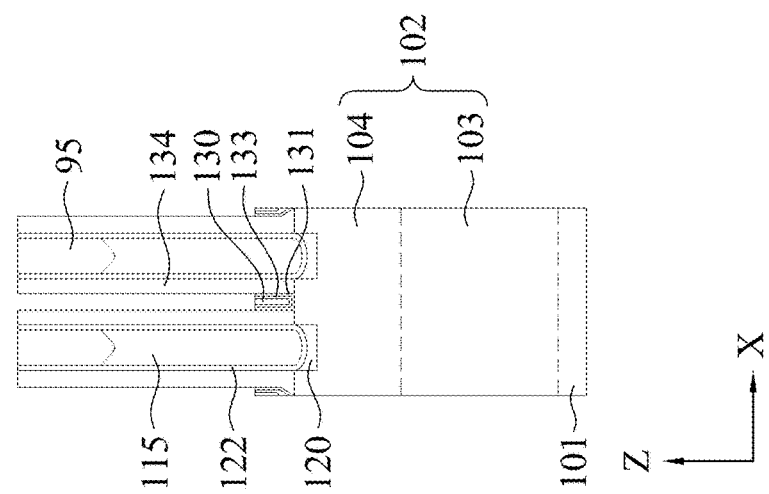
FIGS. 12A, 12B and 12C illustrate one of the various stages in a semiconductor device fabrication process in accordance with embodiments of the present disclosure.
Figure 12B:
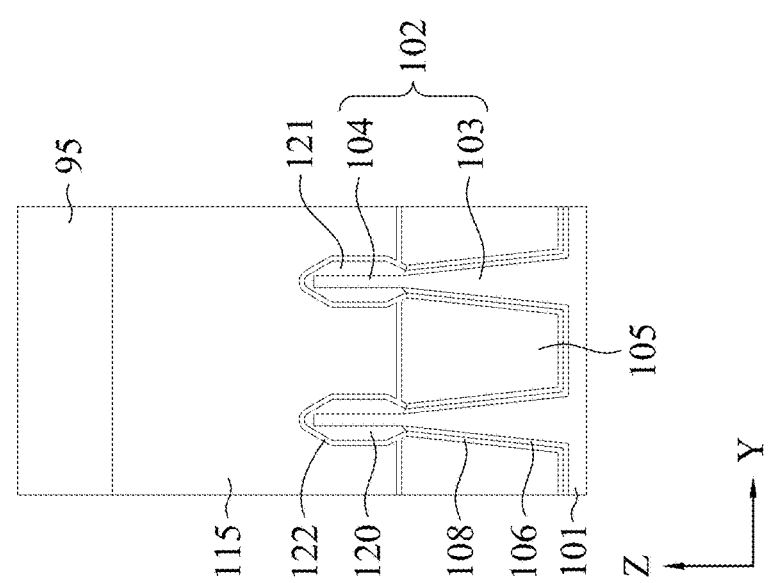
Figure 12C:
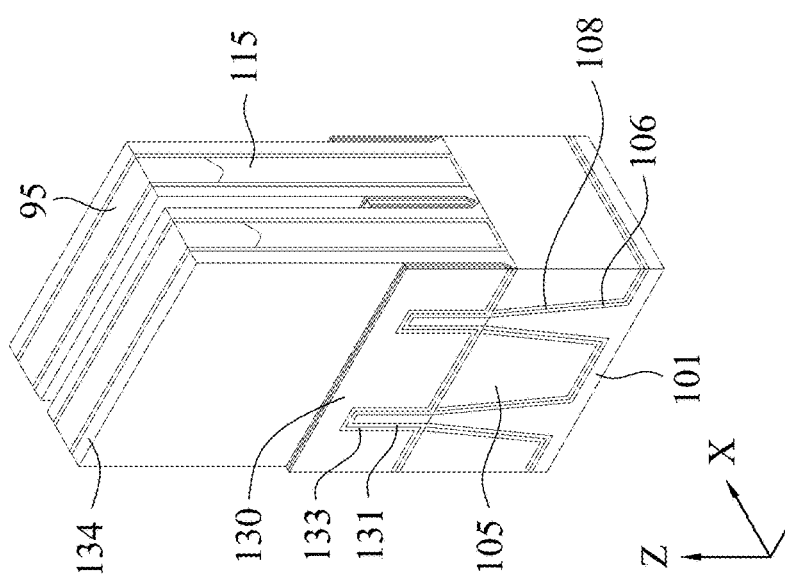
Figure 13C:
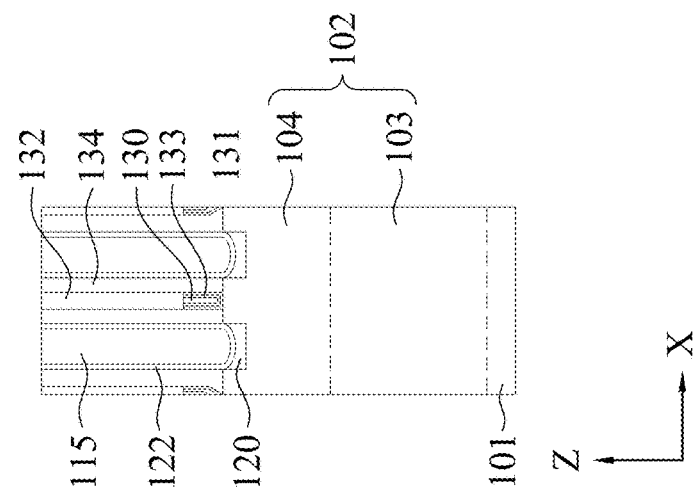
FIGS. 13A, 13B and 13C illustrate one of the various stages in a semiconductor device fabrication process in accordance with embodiments of the present disclosure.
Figure 13B:
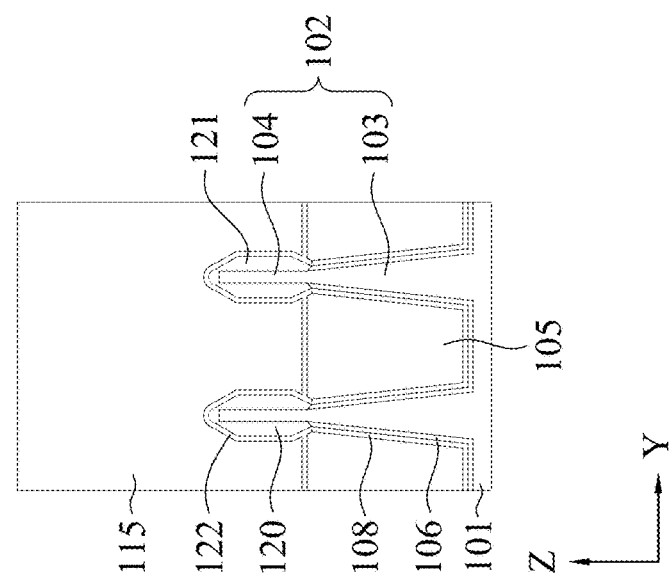
Figure 13A:
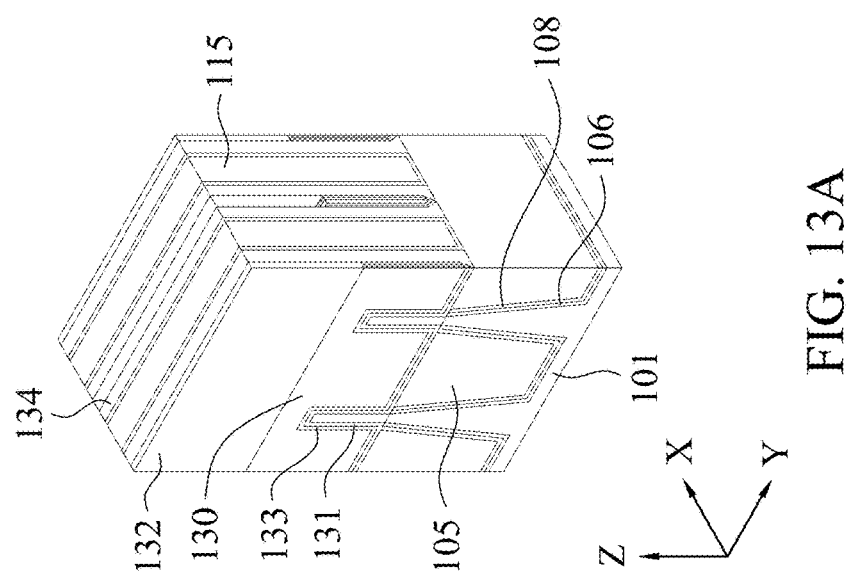

Then, the gate electrode 130, the gate dielectric layer 131 and the work function adjustment layer are recessed, as shown in FIGS. 12A-12C, and a gate cap layer 132 is formed on the recessed gate electrode 130, as shown in FIGS. 13A-13C. In some embodiments, when the gate electrode 130 is mainly made of W, the gate electrode may be recessed using, for example, a dry etch process using $Cl_2/O_2/BCl_3$, at a temperature range of 24° C. to 150° C., and at a pressure below 1 Torr.

After recessing the gate electrode 130, the gate cap layer 132 is formed in the recess to protect the gate electrode 130 during subsequent processes, as shown in FIGS. 13A-13C. In some embodiments, the gate cap layer 132 includes $SiO_2$, SiCN, SiON, $Si_3N_4$, $Al_2O_3$, $La_2O_3$, a combination thereof, or the like, but other suitable dielectric films may be used. The gate cap layer 132 may be formed using, for example, CVD, PVD, spin-on, or the like. Other suitable process steps may be used. A planarization process, such as a CMP, may be performed to remove excess materials.

Figure 14C:
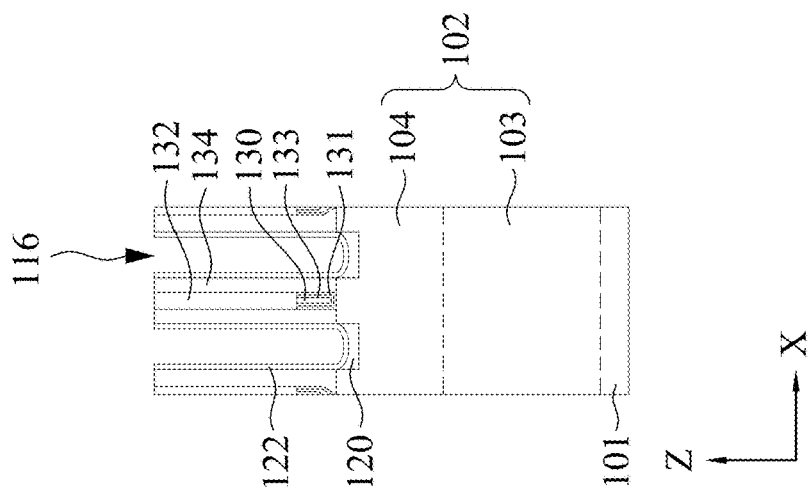
FIGS. 14A, 14B and 14C illustrate one of the various stages in a semiconductor device fabrication process in accordance with embodiments of the present disclosure.
Figure 14B:
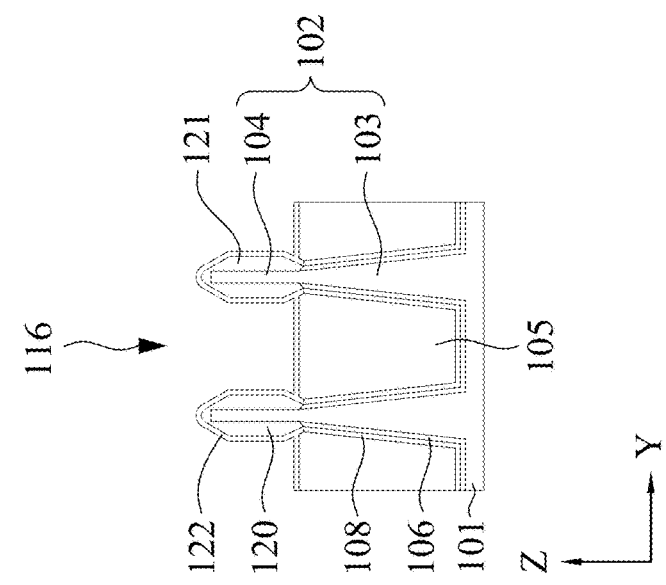
Figure 14A:
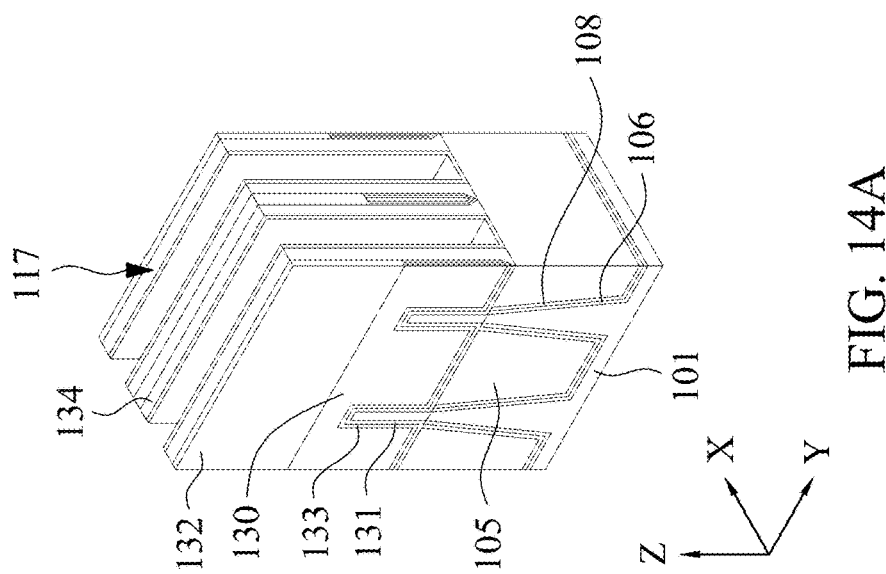

Then, as shown in FIGS. 14A-14C, the first sacrificial layer 115 is at least partially removed from both side regions of the S/D structures 120 and 121, to form openings 116. In some embodiments, the entire first sacrificial layer 115 is removed. The first sacrificial layer 115 may be removed by suitable etching operations, such as dry etching and/or wet etching. The etching operation substantially stops at the first insulating layer 122. In some embodiments, the first insulating layer 122 has a thickness between about 0.5 nm and about 10 nm.

Figure 15C:
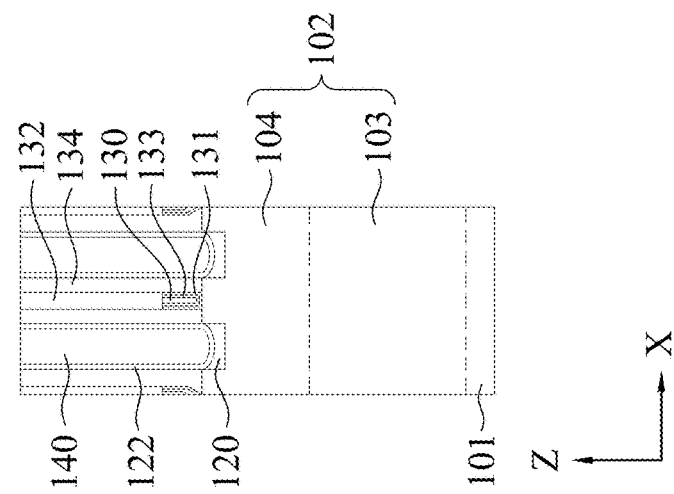
FIGS. 15A, 15B and 15C illustrate one of the various stages in a semiconductor device fabrication process in accordance with embodiments of the present disclosure.
Figure 15B:
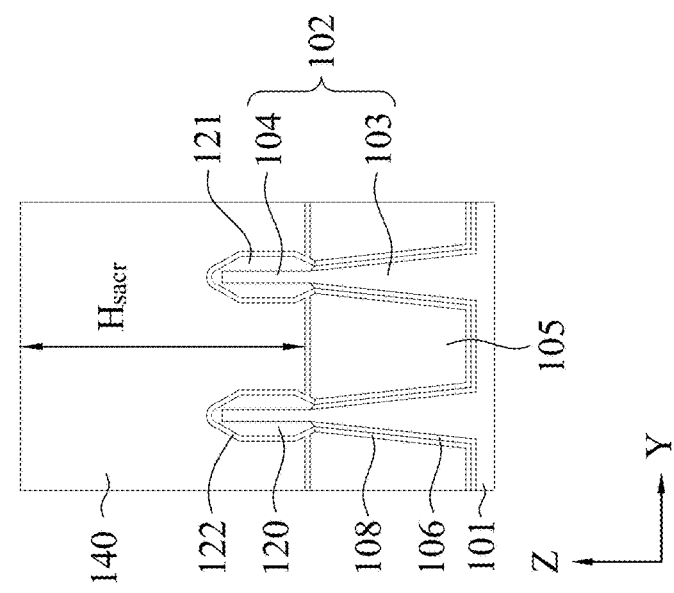
Figure 15A:
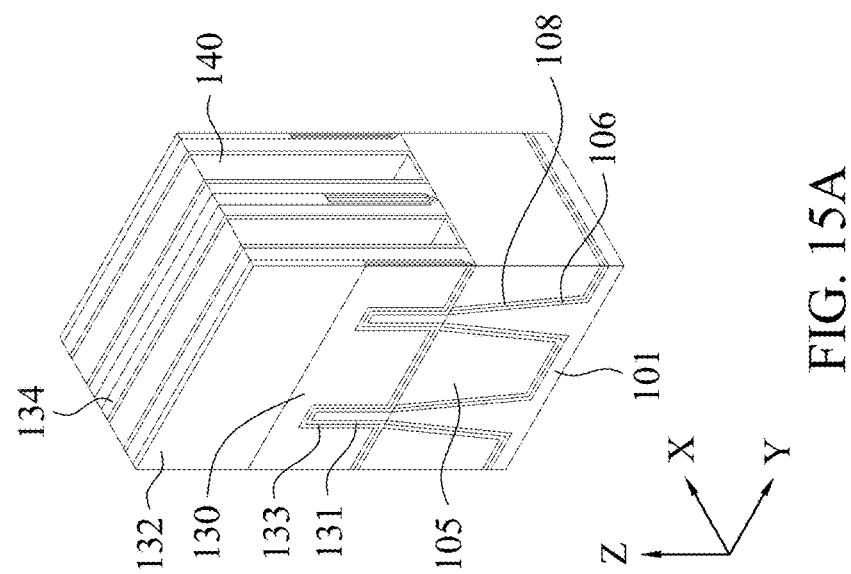
Figures 18A, 18B, 18C:
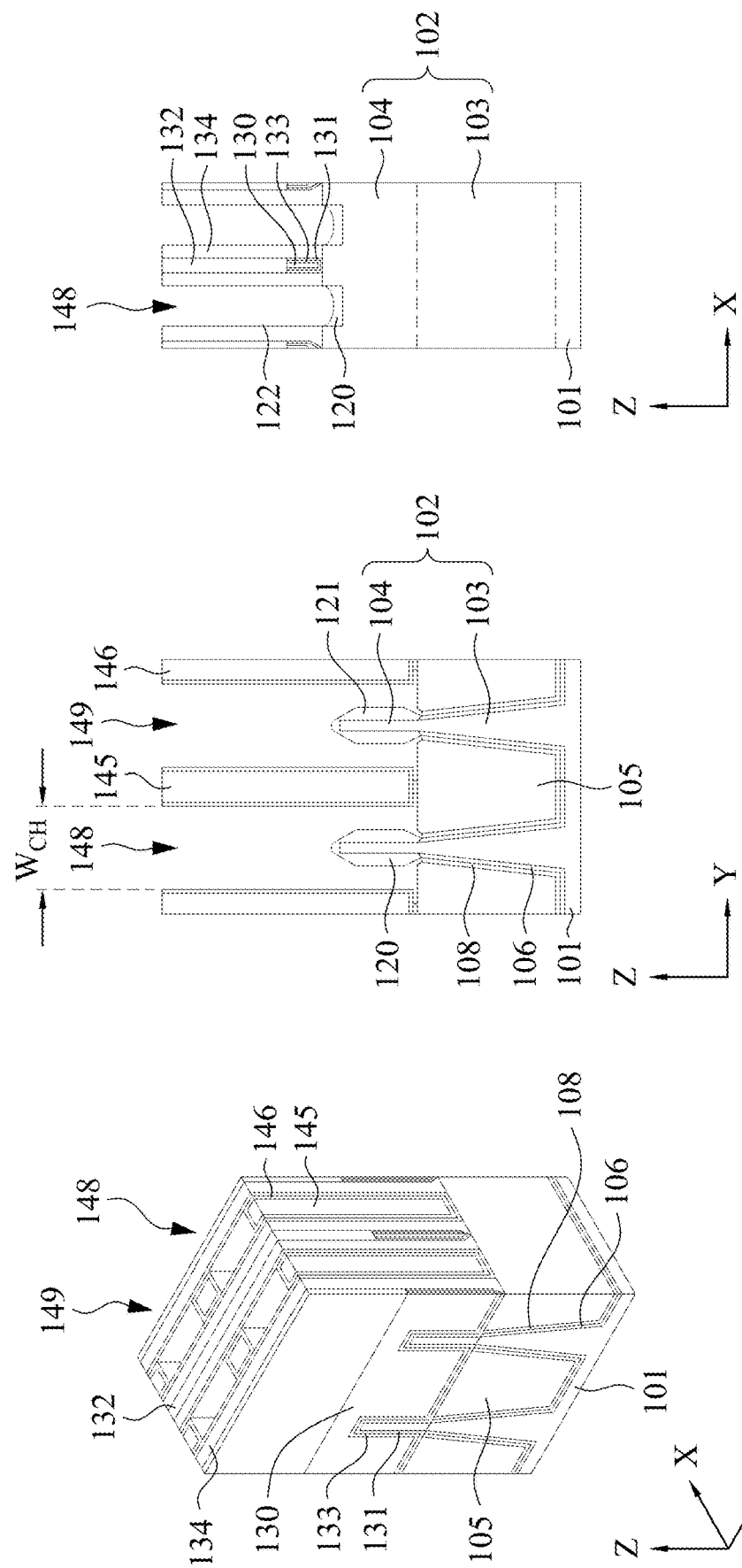
FIGS. 18A, 18B, 18C and 18D illustrate one of the various stages in a semiconductor device fabrication process in accordance with embodiments of the present disclosure.
Figure 18D:
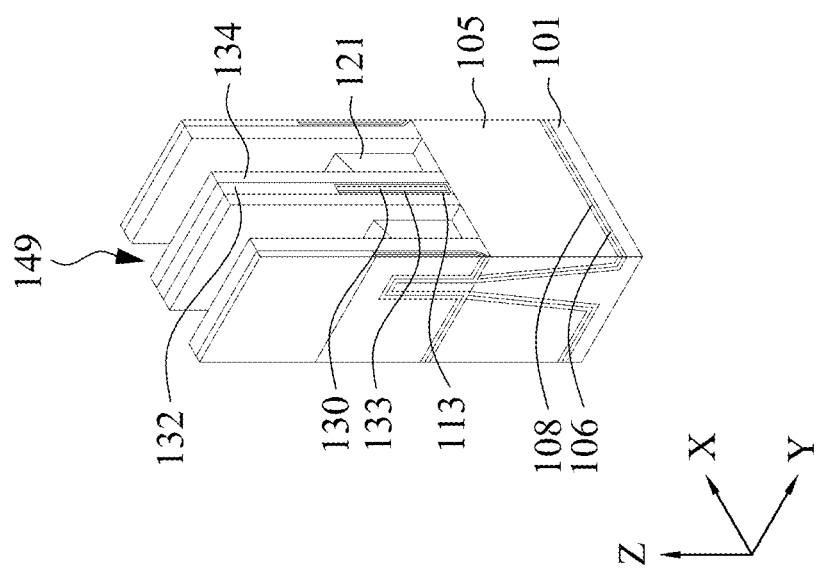

As shown in FIGS. 15A-15C, after the openings 116 are formed, a second sacrificial layer 140 is formed in the openings 116. The second sacrificial layer 140 is made of a material having a higher (e.g., 5 or more) etching selectivity with respect to the materials of the first insulating layer 122 and/or the isolation insulating layer 105. In some embodiments, the second sacrificial layer 140 is made of one or more layers of Group IV elemental or compound materials, such as Si, SiGe, SiC, Ge, SiGeC and GeSn, which may be crystalline, polycrystalline or amorphous and may be doped or un-doped. In other embodiments, the second sacrificial layer 140 is made of one or more silicon based dielectric layers of SiOC, SiC, SiON, SiCN, SiOCN, $Si_3N_4$ and/or $SiO_2$. Aluminum based dielectric materials, such as aluminum oxide, aluminum oxy-carbide and aluminum oxynitride may be used. A SOC (spin-on-carbon) may also be used. In certain embodiments, the second sacrificial layer 140 is made of one or more layers of Group III-V compound semiconductors including, but not limited to, GaAs, GaN, InGaAs, InAs, InP, InSb, InAsSb, AN and/or AlGaN. The second sacrificial layer 140 may be deposited through one or more processes such as PVD, CVD, or ALD, although any acceptable process may be utilized. Other materials and/or processes may be used. In one embodiment, amorphous or poly Si is used as the second sacrificial layer 140. In other embodiments, amorphous or poly $Si_{1-x}Ge_x$, where x is equal to or less than 0.4 is used as the second sacrificial layer 140.

A planarization operation, such as, an etch-back process or CMP, may be performed to planarize the upper surface of the second sacrificial layer 140. By the planarization operation, the upper surface of the gate cap layer 132 is exposed. After the planarization operation, the height $H_{sacr}$ of the second sacrificial layer measured from the surface of the first insulating layer 122 is in a range from about 100 nm to about 350 nm in some embodiments.

Then, as shown in FIGS. 16A-16C, after the second sacrificial layer 140 is formed, a mask pattern is formed over the second sacrificial layer 140, and by using the mask pattern as an etching mask, the second sacrificial layer 140 is patterned by using dry etching, thereby forming openings 144 between the S/D structures 120 and 121. In some embodiments, the etching substantially stops at the first insulating layer 122. FIGS. 16A-16C show the structure after the mask layer is removed.

The mask pattern may be formed by patterning a layer of suitable mask material using a photo-etching operation. The etching operation may include multiple etching processes using different plasma gases. In some embodiments, the mask pattern extends in the X direction over the second sacrificial layer 140 and the gate cap layer 132. The mask pattern is made of one or more layers of dielectric material, such as $SiO_2$, $Si_3N_4$ and/or SiON, and/or TiN, or other suitable materials. The material for the mask pattern may be deposited through one or more processes such as PVD, CVD, or ALD, although any acceptable process may be utilized. Other materials and/or processes may be used.

When a Si based material (e.g., poly-Si or amorphous Si) is used as the second sacrificial layer 140, the etching can be performed by plasma dry etching using, for example, a gas including HBr or a gas including $Cl_2$ and $SF_6$. When SOC (spin-on-carbon) is used as the second sacrificial layer 140, the etching can be performed by plasma dry etching using, for example, a gas including $N_2$ and $H_2$ or a gas including $SO_2$ and $O_2$. When a Si oxide based material formed by FCVD is used as the second sacrificial layer, the etching can be performed by plasma dry etching using, for example, a gas including a fluorocarbon and/or fluorine.

When a Ge based material (e.g., Ge or SiGe) is used as the second sacrificial layer 140, the etching can be performed by plasma dry etching using, for example, a gas including a fluorocarbon or a gas including a halogen. During the etching, the substrate may be heated at a temperature between about 20° C. to about 200° C.

In some embodiments, the opening width $W_{SP}$ in the Y direction is in a range from about 5 nm to about 100 nm. In certain embodiments, the opening width $W_{SP}$ is in a range from about 10 nm to about 40 nm. The width $W_{sp}$ may be other values depending on design rules and/or types of semiconductor devices.

It is noted that as shown in FIGS. 16A and 16C, the first insulating layer 122 and/or the gate cap layer 132 are not substantially etched during the patterning of the second sacrificial layer 140 in some embodiments. In other words, the materials for the first insulating layer 122 and/or the gate cap layer 132 have a high etching selectivity (e.g., 5 or more) with respect to the second sacrificial layer 140 (i.e., lower etching rate than the second sacrificial layer).

Subsequently, as shown in FIGS. 17A-17C, a second insulating layer 146, as a liner layer, is conformally formed over the patterned second sacrificial layer 140 and the isolation insulating layer 105. The second insulating layer 146 is also formed on the sidewall spacers 134 and the gate cap layer 132.

In some embodiments, the second insulating layer 146 includes $SiO_2$, SiCN, SiON, SiCN, SiOCN and $Si_3N_4$, but other suitable dielectric materials may be used. In one embodiment, a silicon nitride based dielectric material, such as $Si_3N_4$, is used. The second insulating layer 146 may be made of a plurality of layers that comprises combinations of the above mentioned materials. In one embodiment, two layers of silicon based dielectric material, at least one of which is silicon nitride based material, are used as the second insulating layer 146. In other embodiments, an aluminum based dielectric layer is used as one layer of the second insulating layer 146. In certain embodiments, the second insulating layer 146 includes a silicon nitride based dielectric layer and a dielectric layer made of a material other than a silicon nitride based material.

The second insulating layer 146 has a higher selective etching ratio to silicon compared to the etching rate of $SiO_2$ to silicon. For example, the etching rates of silicon nitride, silicon oxide, and silicon in $H_3PO_4$ are respectively about 50:5:1.

The second insulating layer 146 may be deposited through one or more processes such as PVD, CVD, molecular layer deposition (MLD) or ALD, although any acceptable process may be utilized. Other materials and/or processes may be used. In the case of ALD, for example, $SiH_4$ (silane), $SiH_2Cl_2$ (dichlorosilane), and/or $SiCl_4$ (silicon tetrachloride), and/or other suitable silicon-containing precursor for the nitride-containing liner layer may be used as a precursor for ALD process.

In some embodiments, the deposition temperature of the second insulating layer 146 is maintained below about 500° C. In other embodiments, the temperature is below about 400° C. The temperature is maintained low to minimize thermal impact on the threshold voltage of the metal-gate/high-k dielectric stack that has already been formed.

In some embodiments, the second insulating layer 146 has a thickness between about 1 nm and about 15 nm. In other embodiments, the thickness is about 3 nm to about 10 nm. Other thicknesses are used in other embodiments.

After the second insulating layer 146 is formed, a first interlayer dielectric (ILD) layer 145 is formed to fill the openings 144 and over the second sacrificial layer 140.

The ILD layer 145 may include a single layer or multiple layers. In some embodiments, the ILD layer 145 includes $SiO_2$, SiCN, SiOC, SiON, SiOCN, $Si_3N_4$ or a low-k material, but other suitable dielectric films may be used. The ILD layer 145 may be formed by CVD, PECVD or ALD, FCVD, or a spin-on-glass process. A planarization process, such as a CMP process, may be performed to remove excess materials. By the planarization process, the upper surface of the second sacrificial layer 140 (and the cap insulation layer 132) is exposed in some embodiments.

When a FCVD is used, a curing process is performed on the flowable isolation dielectric precursor in some embodiments. The curing process may include UV curing, ozone ($O_3$) plasma curing or low-temperature $O_3$ plasma+UV curing (LTB+UV curing), so as to transfer the flowable isolation dielectric precursor into the dielectric layer such as a silicon oxide layer. A processing temperature range of the UV curing process is between about 0° C. and about 10° C., in some embodiments. A processing temperature range of the $O_3$ plasma curing process is between about 100° C. and about 250° C. in some embodiments. A processing temperature range of the LTB+UV curing process is between about 30° C. and about 50° C., in some embodiments. The curing process may be performed only one time after the deposition process to reduce the process time, but not limited thereto, in some embodiments. The deposition process and the curing process can be alternately performed. In other embodiments, the flowable isolation dielectric precursor can also be directly transferred into the dielectric layer through an oxidation process by directly introducing nitrogen, oxygen, ozone or steam.

In order to further increase the structural density of the ILD layer, after the curing process, a thermal treatment process may be performed on the isolation dielectric layer. The thermal treatment process includes a steam containing thermal treatment process (wet annealing) and a nitrogen-containing thermal treatment process (dry annealing). A processing temperature range of the steam-containing thermal treatment is between about 400° C. and about 1000° C., in some embodiments, and the processing temperature of the nitrogen-containing thermal treatment process is between about 1000° C. and about 1200° C. In other embodiments, the temperature of thermal treatment can be reduced to about 400° C. by exposing the film to ultra-violet radiation, e.g., in a ultra-violet thermal processing (UVTP) process.

After the curing or treatment, the ILD layer may have a relative permittivity of less than 6, in some embodiments.

In other embodiments, a spin on dielectric (SOD) process is performed to form the ILD layer 145. In this embodiment, the second insulating layer 146, a nitride-containing liner layer, is formed in the prior process to provide a suitable inter layer to the deposited isolation dielectric layer in the contact isolation region by the SOD process. Therefore, the ILD layer may be formed by the SOD process using a suitable precursor.

In the SOD process for the ILD layer 145, the precursor may be organosilicon compounds, such as but not limited to siloxane, methylsiloxane, polysilazane and hydrogensilsesquioxane, perhydropolysilazane (PHPS), and other suitable materials. The SOD precursor is dissolved in a compatible organic solvent commonly used in coating solutions of spin-on chemicals. Suitable organic solvents include, for example, dibutyl ether (DBE), toluene, xylene, propyleneglycolmonomethyletheracetate (PGMEA), ethyl lactate and isopropyl alcohol (IPA), and the like. In some embodiments xylene is used as the solvent for PHPS. The concentration of the SOD precursor in solution can be varied to adjust the consistency (i.e., viscosity) of the solution and thickness of the coating. A solution containing between about 4% to about 30% by weight of the SOD precursor is used, in some embodiments. In other embodiments, a solution containing about 8% to about 20% by weight SOD precursor is used. Additional minor amounts of additives such as surfactants and binders can be included in the solution.

The wafer is spun to uniformly spread SOD precursor from wafer center to edge during the precursor spin-on process. The spin speed of cast rotation for a SOD precursor coating on substrate is from 100 rpm to 3000 rpm, in some embodiments, for a 12 inch wafer. The dynamic dispense rate of SOD precursor is around 1 ml/sec in some embodiments, and the dispense puddle spreads completely to the edge of the wafer at rotation speeds below 3000 rpm. The SOD precursor can therefore totally cover the bottom of contact isolation hole and fill the opening 144.

Subsequently, a prebaking process is performed after SOD deposition to stabilize the SOD layer. The prebaking process is performed at low temperature in a range of about 100° C. to about 200° C. in air ambient, in some embodiments. A thermal treatment process is performed after prebaking process to densify the SOD layer. The thermal treatment process is an annealing process performed at high temperature in a range of about 400° C. to about 1100° C., in some embodiments. The annealing process may be a wet annealing process using a gas including steam, $O_2$ and $H_2$ gas or a dry annealing process using a gas including $N_2$ and $O_2$ gas. In the other embodiments, the thermal treatment process uses plasma at a lower temperature in a range of about 150° C. to about 400° C.

Subsequently, as shown in FIGS. 18A-18D, the second sacrificial layer 140 is removed, thereby forming contact openings 148 and 149 to expose the S/D structures 120, 121 covered by the first insulating layer 122. The etching operation to remove the second sacrificial layer 140 may be isotropic or anisotropic. In addition, the first insulating layer 122 is removed, thereby exposing the S/D structures 120, 121.

When a Si based material (e.g., poly-Si or amorphous Si) is used as the second sacrificial layer 140, the etching can be performed by plasma dry etching using a gas including $Cl_2$ and $NF_3$ or a gas including $F_2$, or wet etching using $NH_4OH$ and/or tetramethylammonium (TMAH). When SOC (spin-on-carbon) is used as the second sacrificial layer 140, the etching can be performed by plasma dry etching using, for example, a gas including $N_2$ and $H_2$ or a gas including $SO_2$ and $O_2$. When a Si oxide based material formed by FCVD is used as the second sacrificial layer, the etching can be performed by wet etching using, for example, HF or buffered HF (BHF).

When a Ge based material (e.g., Ge or SiGe) is used as the second sacrificial layer 140, the etching can be performed by plasma dry etching using, for example, ozone, or wet etching using a solution containing $NH_4OH$ and $H_2O_2$ or a solution containing HCl and $H_2O_2$.

The remaining first insulating layer 122 can be removed by using a suitable etching operation. In some embodiments, during the etching of the first insulating layer 122, the second insulating layer 146 is also etched when the second insulating layer 146 is made of the same or similar material as the second insulating layer 122. In certain embodiments, the second insulating layer 146 is fully removed from the wall of the contact openings 148 and 149. However, even in such a case, the second insulating layer 146 remains at the bottom of the ILD layer 145 in some embodiments.

Since the etching rate for the second sacrificial layer 140 is higher than other materials, it is possible to remove the second sacrificial layer 140 without causing damage in the other layers, for example, the gate cap layer 132, the sidewall spacers 134, the first insulating layer 122, the ILD layer 145 and/or the second insulating layer 146.

The width $W_{CH}$ along the Y direction of the openings 148, 149 is in a range from about 10 nm to about 100 nm in some embodiments. In other embodiments, the width $W_{CH}$ is in a range from about 15 nm to about 50 nm.

In some embodiments, an ion implantation operation and/or a plasma doping operation to introduce Ga into the S/D epitaxial layer 121 is performed, in addition to or instead of the in-situ epitaxial doping performed in the operations explained with respect to FIGS. 4A-4C.

Figure 19C:
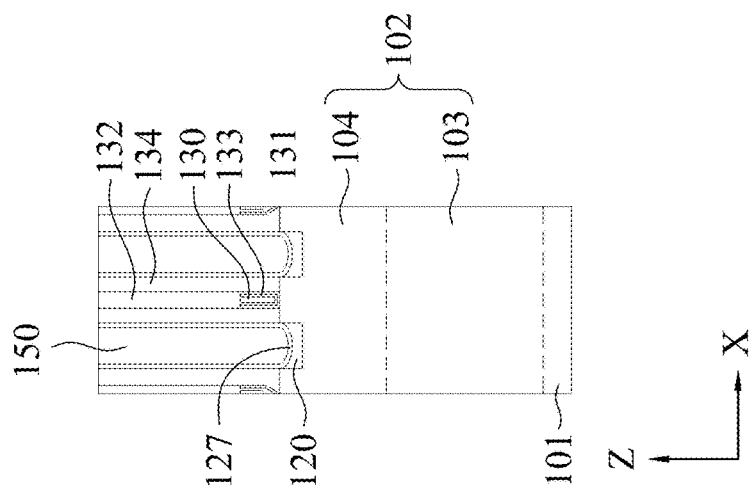
FIGS. 19A, 19B and 19C illustrate one of the various stages in a semiconductor device fabrication process in accordance with embodiments of the present disclosure.
Figure 19B:
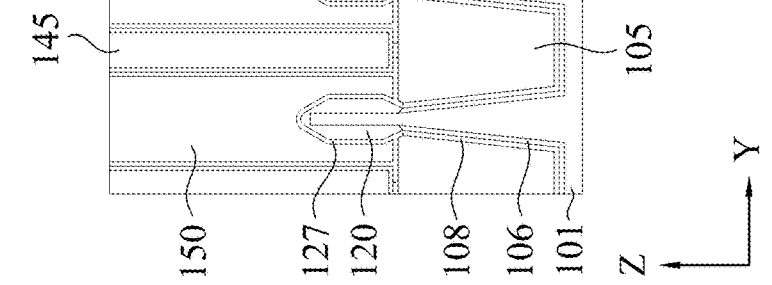
Figure 19A:
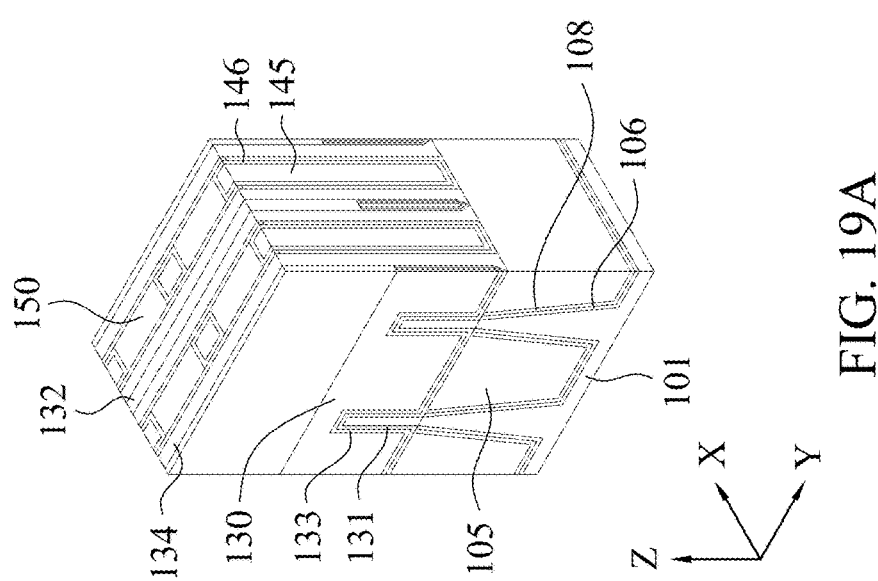

After the second sacrificial layer and the first insulating layer 122 formed on the S/D structures 120, 121 are removed, a conductive material is filled in the contact openings 148, 149, thereby forming S/D contacts 150, as shown in FIGS. 19A-19C.

In some embodiments, a silicide layer 127 is formed on the exposed S/D structures 120, 121. The metal silicide formation process may form a metal silicide on the side portions of the S/D structures. The metal silicide formation process includes a metal film deposition on the S/D structures, a thermal treatment to form a metal at the interface or surface of the S/D structures, and an etching process to remove the excess unreacted metal. The metal silicide comprises $WSi_x$, $TiSi_x$, $NiSi_x$, $CoSi_x$, $NiCoSi_x$, and $TaSi_x$, but other suitable silicide materials may be used. In some embodiments, when the S/D structures 120, 121 include Gab, the silicide layer 127 also contains Ga. Other Group IV metal alloys containing one or more of Si, Ge and Sn reacted with one or more of Ti, Ni, Co, Ta and W can be used as the silicide layer 127. When the S/D structures 120, 121 do not include Si, a silicide layer 127 is formed from a reaction between Si source (a gas or a Si layer) and a metal source (a gas or a metal layer).

In some embodiments, the silicide layer has a thickness between about 0.5 nm and about 10 nm. In other embodiments, a silicide layer is not formed at this stage of the manufacturing operations, and may be formed at an earlier manufacturing stage, e.g., before forming the first insulating layer 122. In some embodiments, a metal film is also formed on the second insulating layer 146 and the isolation insulating layer 105. The metal films not formed on the S/D epitaxial layer and the metal films not consumed to form the silicide layer are removed by a suitable etching operation in some embodiments. In other embodiments, the metal films are not removed and remain.

The S/D contacts 150 may include a single layer or a multi-layer structure. For example, in some embodiments, the contact 150 includes a contact liner layer, such as a diffusion barrier layer, an adhesion layer, or the like, and a contact body formed over the contact liner layer in the contact openings 148, 149. The contact liner layer may include Ti, TiN, Ta, TaN, or the like formed by ALD, CVD, or the like. The contact body may be formed by depositing a conductive material, such as one or more layers of Ni, Ta, TaN, W, Co, Ti, TiN, Al, Cu, Au, alloys thereof, combinations thereof, or the like, but other suitable metals may also be used. A planarization process, such as a CMP, may be performed to remove excess material from a surface of the ILD layer 145.

After the S/D contact 150 is formed, the height $H_g$ of the gate structure including the gate cap layer 132 measured from the top of the fin structure 102 is in a range from about 20 nm to 100 nm and the height of the metal gate 130 measured from the top of the fin structure 102 is in a range from about 10 nm to about 60 nm in some embodiments.

After forming the contact 150, further CMOS processes are performed to form various features such as additional interlayer dielectric layers, contacts/vias, interconnect metal layers, and passivation layers, etc.

FIGS. 20A-22C illustrate various processes in a semiconductor device fabrication process in accordance with other embodiments of the present disclosure. Throughout the various views and illustrative embodiments, like reference numbers are used to designate like elements. In FIGS. 20A-22C, the "A" figures (e.g., FIGS. 20A, 21A, etc.) illustrate a perspective view, the "B" figures (e.g., FIGS. 20B, 21B, etc.) illustrate a cross-sectional view along the Y direction corresponding to line Y1-Y1 illustrated in FIG. 3A, and the "C" figures (e.g., FIG. 20C, 21C, etc.) illustrate a cross-sectional view along the X direction corresponding to line X1-X1 illustrated in FIG. 3A. It is understood that additional operations can be provided before, during, and after processes shown by FIGS. 20A-22C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-19C may be employed in the following embodiments, and detailed explanation thereof may be omitted.

Figures 20A, 20B, 20C:
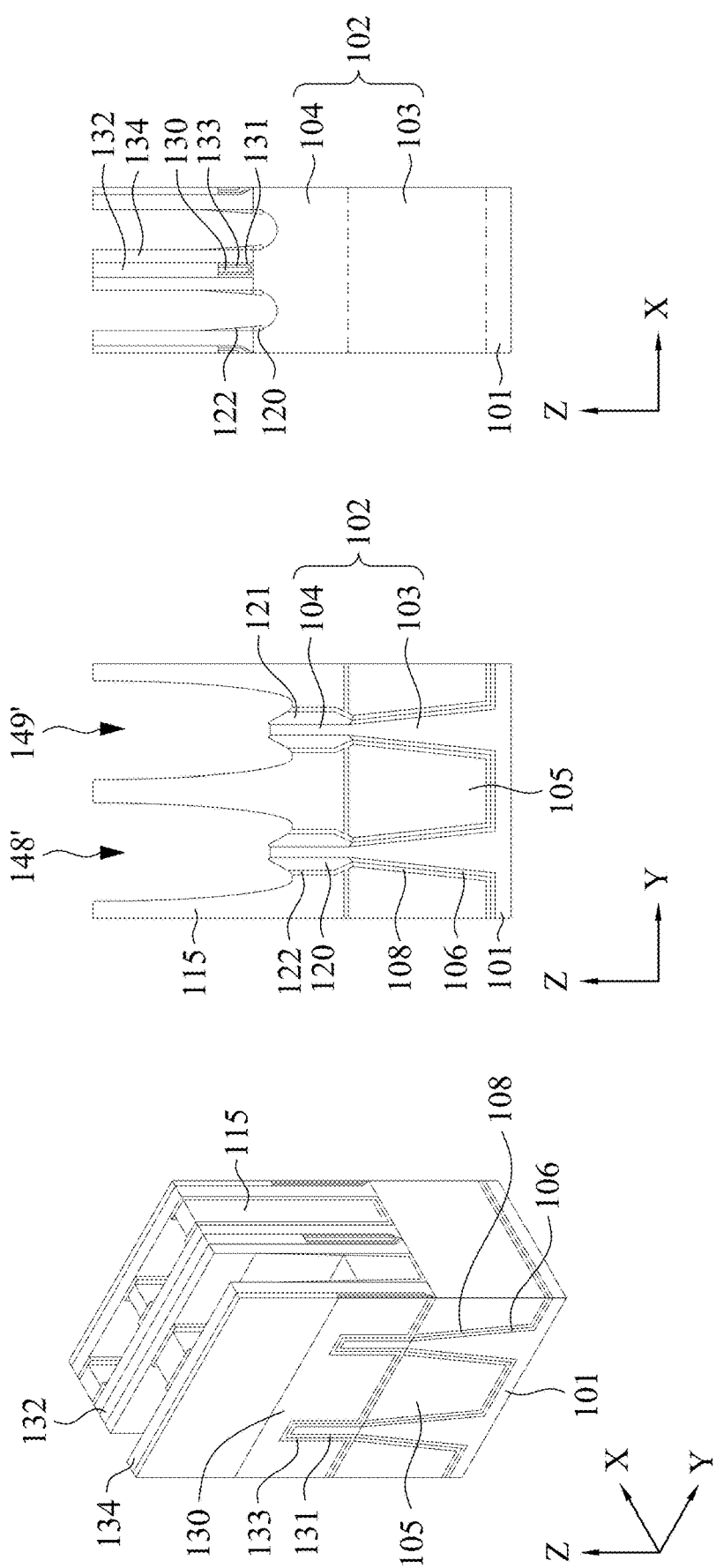
FIGS. 20A, 20B and 20C illustrate one of the various stages in a semiconductor device fabrication process in accordance with other embodiments of the present disclosure.

After the structure shown in FIGS. 13A-13C is formed, the first sacrificial layer 115, which is used as a first interlayer dielectric layer in this embodiment, is patterned to form contact openings 148' and 149', as shown in FIGS. 20A-20C. One or more lithography and etching operations are employed to form the contact openings 148' and 149'.

In some embodiments, an ion implantation operation and/or a plasma doping operation to introduce Ga into the S/D epitaxial layer 121 is performed, in addition to or instead of the in-situ epitaxial doping performed in the operations explained with respect to FIGS. 4A-4C.

Figure 21C:
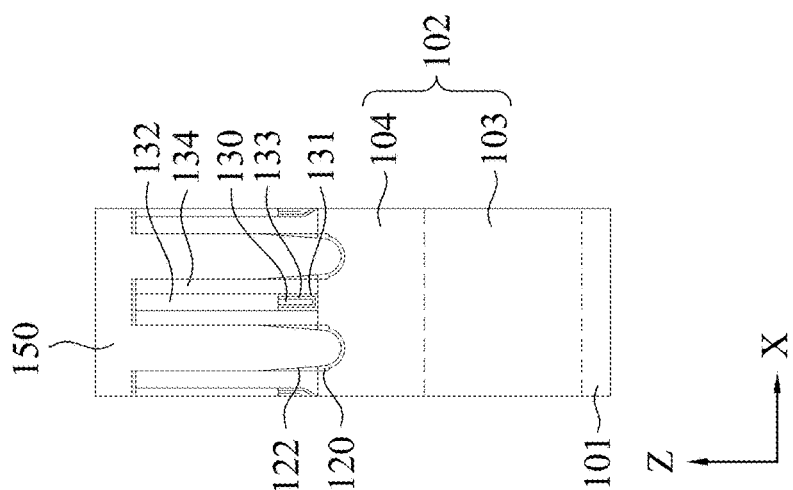
FIGS. 21A, 21B and 21C illustrate one of the various stages in a semiconductor device fabrication process in accordance with other embodiments of the present disclosure.
Figure 21B:
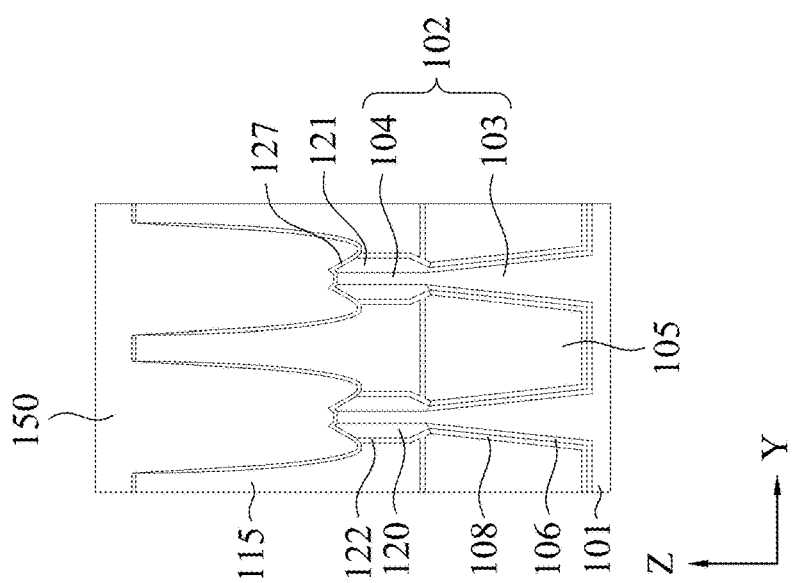
Figure 21A:
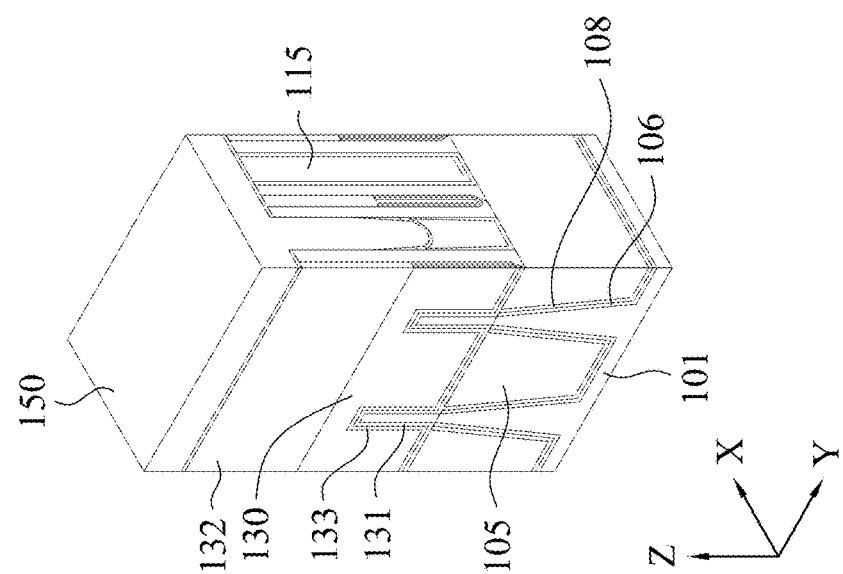
Figure 22C:
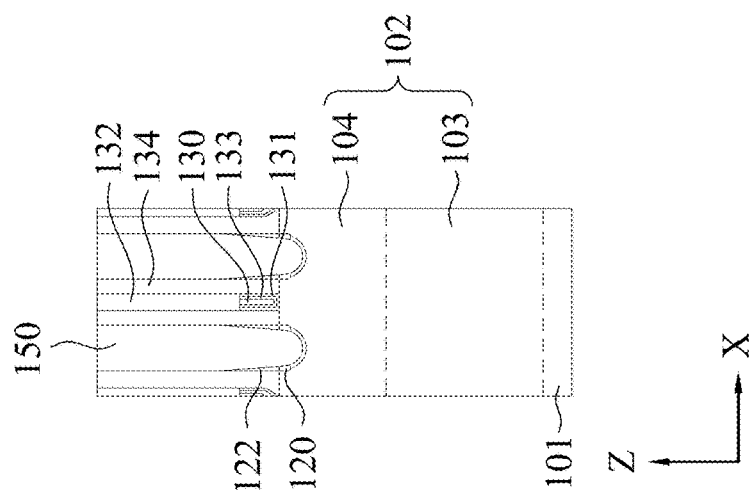
FIGS. 22A, 22B and 22C illustrate one of the various stages in a semiconductor device fabrication process in accordance with other embodiments of the present disclosure.
Figure 22B:
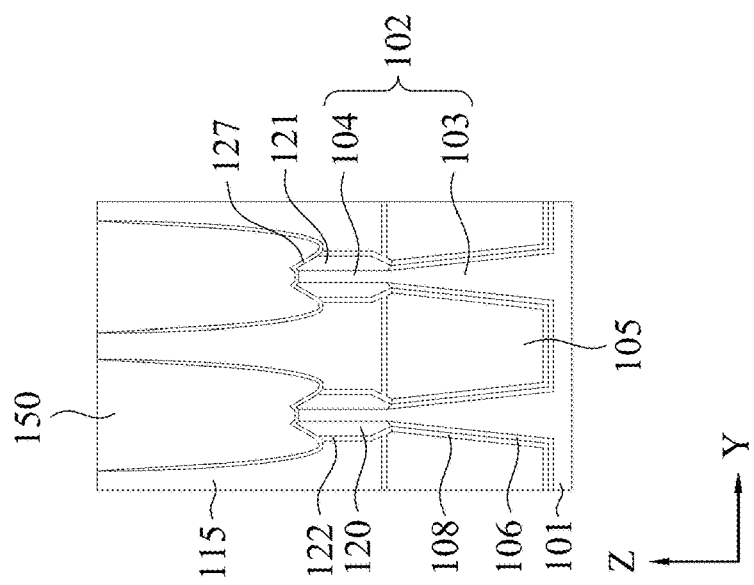
Figure 22A:
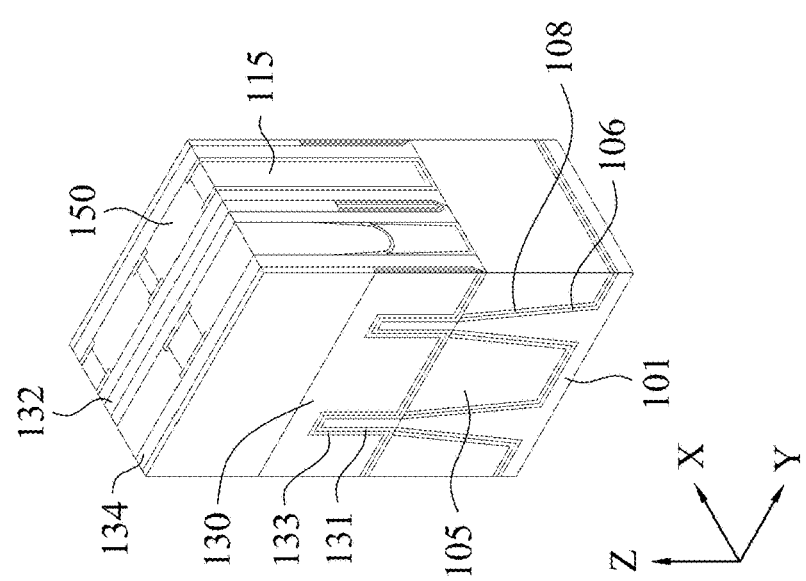

Similar to the operation explained with FIGS. 19A-19C, a silicide and/or germanide layer 127 is formed on the exposed S/D structures 120, 121. The conductive material layer 150 is formed in the openings 148' and 149' and the ILD layer 115, as shown in FIGS. 21A-21C. The conductive material layer for the S/D contacts 150 may include a single layer or a multi-layer structure. A planarization process, such as a CMP, may be performed to remove excess material from a surface of the ILD layer 145, as shown in FIGS. 22A-22C.

After forming the contact 150, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, by containing Ga in a source/drain epitaxial structure for a p-type FET, it is possible to improve electrical properties (e.g., contact resistance) of the S/D regions for a p-type FET.

In accordance with an aspect of the present disclosure, a semiconductor device includes a field effect transistor (FET). The FET includes a channel region and a source/drain region disposed adjacent to the channel region, and a gate electrode disposed over the channel region. The channel region is made of Si. The source/drain region includes an epitaxial layer including at least one of SiGe doped with Ga, GeSn doped with Ga, SiGeSn doped with Ga. In one or more of the foregoing or following embodiments, the epitaxial layer includes $Si_{1-x-y}Ge_xSn_y$ doped with Ga, where $0.6 \leq x \leq 1.0$. In one or more of the foregoing or following embodiments, the FET is a p-type FET. In one or more of the foregoing or following embodiments, a concentration of Ga is in a range from $1 \times 10^{18}$ atoms/cm$^3$ to $1 \times 10^{22}$ atoms/cm$^3$. In one or more of the foregoing or following embodiments, a concentration of Ga is in a range from $5 \times 10^{18}$ atoms/cm$^3$ to $7 \times 10^{21}$ atoms/cm$^3$. In one or more of the foregoing or following embodiments, the epitaxial layer is further doped with boron. In one or more of the foregoing or following embodiments, the epitaxial layer is further doped with indium. In one or more of the foregoing or following embodiments, a concentration of Ga decreases from an outer surface of the epitaxial layer toward inside the epitaxial layer.

In accordance with another aspect of the preset disclosure, a semiconductor device includes fin field effect transistors (FinFETs) including a p-type FinFET and an n-type FinFET. The p-type FinFET includes a first fin structure, a first source/drain structure and a first source/drain contact in contact with the first source/drain structure, and the n-type FinFET includes a second fin structure, a second source/drain structure and a second source/drain contact in contact with the second source/drain structure. At least one of the first and second source/drain structures includes a first epitaxial layer including at least one of SiGe doped with Ga, GeSn doped with Ga, SiGeSn doped with Ga. In one or more of the foregoing or following embodiments, the first source/drain structure includes the first epitaxial layer. In one or more of the foregoing or following embodiments, the first epitaxial layer includes $Si_{1-x-y}Ge_xSn_y$ doped with Ga, where $0.6 \leq x \leq 1.0$. In one or more of the foregoing or following embodiments, the first epitaxial layer is $Si_{1-x}Ge_x$ doped with Ga, where $0.6 \leq x \leq 1.0$. In one or more of the foregoing or following embodiments, the first epitaxial layer includes $Si_{1-x-y}Ge_xSn_y$ doped with Ga, where $0.6 \leq x \leq 1.0$, $0 < y < 0.4$ and $1-x-y$ is not zero. In one or more of the foregoing or following embodiments, a concentration of Ga is in a range from $1 \times 10^{18}$ atoms/cm$^3$ to $1 \times 10^{22}$ atoms/cm$^3$. In one or more of the foregoing or following embodiments, a concentration of Ga is in a range from $5 \times 10^{18}$ atoms/cm$^3$ to $7 \times 10^{21}$ atoms/cm$^3$. In one or more of the foregoing or following embodiments, the epitaxial layer is further doped with one selected from the group consisting of boron and indium. In one or more of the foregoing or following embodiments, a concentration of Ga increases from a region adjacent to the first fin structure to a region adjacent to an outer surface of the first epitaxial layer. In one or more of the foregoing or following embodiments, the concentration of Ga continuously increases. In one or more of the foregoing or following embodiments, the concentration of Ga increases in a stepwise manner. In one or more of the foregoing or following embodiments, the semiconductor device further includes a dielectric layer separating the first source/drain structure and the second source/drain structure. The dielectric layer is made of silicon-based insulating material, and contains Ga at or near an interface between the dielectric layer and one of the first and second source/drain contacts. In one or more of the foregoing or following embodiments, the second source/drain structure includes a second epitaxial layer, the first epitaxial layer wraps around a source/drain region of the first fin structure, and the second epitaxial layer wraps around a source/drain region of the second fin structure. In one or more of the foregoing or following embodiments, the second epitaxial layer includes Si doped with P. In one or more of the foregoing or following embodiments, the first source/drain contact wraps around the first epitaxial layer, and the second source/drain contact wraps around the second epitaxial layer.

In accordance with another aspect of the present disclosure in a method of forming a semiconductor device including a fin field effect transistor (FinFET), a first sacrificial layer is formed over a source/drain structure of a FinFET structure and an isolation insulating layer. The first sacrificial layer is patterned, thereby forming an opening. A first liner layer is formed on the isolation insulating layer in a bottom of the opening and on at least side faces of the patterned first sacrificial layer. After the first liner layer is formed, a dielectric layer is formed in the opening. After the dielectric layer is formed, the patterned first sacrificial layer is removed, thereby forming a contact opening over the source/drain structure. A conductive layer is formed in the contact opening. The FinFET is a p-type FET, and the source/drain structure includes an epitaxial layer including $Si_{1-x-y}Ge_xSn_y$ doped with Ga, where $0.6 \leq x \leq 1.0$.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device including a fin field effect transistor (FinFET), the method comprising:
    forming a dummy gate structure over a fin structure;
    forming a cover layer over a source/drain structure of the fin structure and an isolation insulating layer;
    after the cover layer is formed, forming a metal gate structure by a gate replacement process;

after the metal gate structure is formed, removing the cover layer;

after the cover layer is removed, forming a sacrificial layer over the source/drain structure by a deposition method;

patterning the sacrificial layer, thereby forming an opening;

forming a first liner layer on the isolation insulating layer in a bottom of the opening and on at least side faces of the patterned first sacrificial layer;

after the first liner layer is formed, forming a dielectric layer in the opening;

after the dielectric layer is formed, removing the patterned first sacrificial layer, thereby forming a contact opening over the source/drain structure; and forming a conductive layer in the contact opening, wherein the source/drain structure includes an epitaxial layer including at least one selected from the group consisting of SiGe doped with Ga, GeSn doped with Ga, SiGeSn doped with Ga.

2. The method of claim 1, wherein the epitaxial layer includes at least one selected from the group consisting of
$Si_{1-x-y}Ge_xSn_y$ doped with Ga, where $0.6 \le x \le 1.0$,
$Si_{1-x}Ge_x$ doped with Ga, where $0.6 \le x < 1.0$, and
$Si_{1-x-y}Ge_xSn_y$ doped with Ga, where x is equal to or greater than 0.6 and less than 1.0, y is greater than 0 and less than 0.4 and 1-x-y is not zero.

3. The method of claim 2, wherein a concentration of Ga is in a range from $1 \times 10^{18}$ atoms/cm$^3$ to $1 \times 10^{22}$ atoms/cm$^3$.

4. The method of claim 1, wherein the FET is a p-type FET.

5. The method of claim 1, wherein the epitaxial layer includes $Si_{1-x-y}Ge_xSn_y$ doped with Ga, where $0.6 \le x \le 1.0$.

6. The method of claim 1, wherein the epitaxial layer is further doped with boron or indium.

7. The method of claim 1, wherein a concentration of Ga decreases from an outer surface of the epitaxial layer toward inside the epitaxial layer.

8. The method of claim 1, further comprising forming a source/drain contact contacting the epitaxial layer and a source/drain region of the fin structure.

9. The method of claim 1, wherein before the sacrificial layer is formed, an insulating layer is formed over the source/drain structure and the isolation insulating layer.

10. A method of forming a semiconductor device, the method comprising:

forming a fin structure over a substrate;

forming an isolation insulating layer so that an upper portion of the fin structure protrudes from the isolation insulating layer;

forming an epitaxial layer over a source/drain region of the fin structure;

forming a first dielectric layer over the epitaxial layer;

forming a gate structure including a metal gate electrode;

after the gate structure is formed, removing the first dielectric layer over the epitaxial layer;

after the first dielectric layer is removed, forming a second dielectric layer by deposition and patterning operations such that the epitaxial layer is exposed in an opening formed in the second dielectric layer; and forming a conductive contact over the exposed epitaxial layer in the opening, wherein the epitaxial layer includes Ge and Ga.

11. The method of claim 10, wherein a concentration of Ga is in a range from $1 \times 10^{18}$ atoms/cm$^3$ to $1 \times 10^{22}$ atoms/cm$^3$.

12. The method of claim 10, wherein the epitaxial layer includes at least one selected from the group consisting of SiGe doped with Ga, GeSn doped with Ga, and SiGeSn doped with Ga.

13. The method of claim 10, wherein a concentration of Ga decreases from an outer surface of the epitaxial layer toward inside the epitaxial layer.

14. The method of claim 10, wherein the conductive contact contacts the epitaxial layer and the source/drain region of the fin structure.

15. The method of claim 10, wherein the conductive contact is in contact with the isolation insulating layer.

16. The method of claim 10, wherein the conductive contact includes a silicide layer and a metal layer.

17. A method of forming a semiconductor device, the method comprising:

forming a first dielectric layer over an epitaxial layer formed over a source/drain region of a fin structure and an isolation insulating layer;

forming a gate structure including a metal gate electrode;

after the gate structure is formed, removing the first dielectric layer over the epitaxial layer;

forming a sacrificial layer over the epitaxial layer;

patterning the sacrificial layer;

forming a second dielectric layer;

removing the patterned sacrificial layer so that the epitaxial layer is exposed; and forming a conductive contact over the exposed epitaxial layer, wherein:

a part of the conductive contact is disposed between the isolation insulating layer and the second dielectric layer disposed between the fin structure and an adjacent fin structure, and the epitaxial layer includes at least one selected from the group consisting of SiGe doped with Ga, GeSn doped with Ga, SiGeSn doped with Ga.

18. The method of claim 17, wherein before the sacrificial layer is formed, an insulating layer is formed over the source/drain structure and the isolation insulating layer.

19. The method of claim 17, wherein before the second dielectric layer is formed, an insulating layer is formed over the patterned sacrificial layer and the isolation insulating layer.

20. The method of claim 17, wherein the sacrificial layer is made of one or more of Group IV elemental or compound materials.

* * * * *